(12) United States Patent
Lee et al.

(10) Patent No.: US 10,390,445 B2
(45) Date of Patent: Aug. 20, 2019

(54) DISPLAY DEVICE

(71) Applicant: LG ELECTRONICS INC., Seoul (KR)

(72) Inventors: Mansuk Lee, Seoul (KR); Namhun Kim, Seoul (KR); Mingeun Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/478,169

(22) Filed: Apr. 3, 2017

(65) Prior Publication Data

US 2017/0303407 A1 Oct. 19, 2017

(30) Foreign Application Priority Data

Apr. 18, 2016 (KR) .................. 10-2016-0046904

(51) Int. Cl.
| | |
|---|---|
| *H05K 5/00* | (2006.01) |
| *H05K 7/00* | (2006.01) |
| *H05K 5/02* | (2006.01) |
| *G06F 3/14* | (2006.01) |
| *G09F 9/302* | (2006.01) |
| *G09F 15/00* | (2006.01) |
| *H01L 25/10* | (2006.01) |
| *G09F 7/18* | (2006.01) |

(52) U.S. Cl.
CPC ......... *H05K 5/0021* (2013.01); *G06F 3/1446* (2013.01); *G09F 9/3026* (2013.01); *G09F 15/0068* (2013.01); *H01L 25/10* (2013.01); *H05K 5/0234* (2013.01); *G09F 2007/1891* (2013.01)

(58) Field of Classification Search
CPC ..................................................... G06F 3/1446
USPC ..................................................... 361/679.01
See application file for complete search history.

(56) References Cited

U.S. PATENT DOCUMENTS

2004/0021631 A1* 2/2004 McLaughlin ............ G09F 9/30
345/156
2005/0285811 A1 12/2005 Kawase et al.
(Continued)

FOREIGN PATENT DOCUMENTS

| CN | 104965329 | 10/2015 |
|---|---|---|
| EP | 1995508 | 11/2008 |
| JP | H09130701 | 5/1997 |

OTHER PUBLICATIONS

European Patent Office Application Serial No. 17166850.2, Search Report dated Sep. 15, 2017, 10 pages.
(Continued)

*Primary Examiner* — Jerry Wu
(74) *Attorney, Agent, or Firm* — Lee, Hong, Degerman, Kang & Waimey PC

(57) ABSTRACT

A display device is disclosed. The display device includes a plurality of stand assemblies, a plurality of center frames correspondingly coupled to upper portions of the plurality of stand assemblies, and a plurality of display panels positioned on at least one side of the plurality of center frames. At least a portion of the plurality of display panels are arranged to form a curved surface. Two adjacent display panels of the plurality of display panels are arranged to form an overlap area wherein at least portions of the two adjacent display panels overlap each other.

9 Claims, 54 Drawing Sheets

(56) References Cited

U.S. PATENT DOCUMENTS

2010/0041439 A1\* 2/2010 Bullister .............. G06F 1/1615
455/566
2012/0182295 A1\* 7/2012 Schilling .............. G06F 1/1615
345/419
2016/0210103 A1\* 7/2016 Yoshizumi ........... G06F 3/1446

OTHER PUBLICATIONS

State Intellectual Property Office of the People's Republic of China Application Serial No. 201710248870.4, Office Action dated Jan. 24, 2019, 17 pages.

\* cited by examiner

DISPLAY DEVICE

CROSS-REFERENCE TO RELATED APPLICATIONS

Pursuant to 35 U.S.C. § 119(a), this application claims the benefit of earlier filing date and right of priority to Korean Patent Application No. 10-2016-0046904 filed on Apr. 18, 2016, the contents of which are hereby incorporated by reference herein in its entirety.

BACKGROUND OF THE INVENTION

Field of the Invention

The present disclosure relates to a display device.

Discussion of the Related Art

With the development of the information society, various demands for display devices are increasing. Various display devices, such as liquid crystal displays (LCDs), plasma display panels (PDPs), electroluminescent displays (ELDs), and vacuum fluorescent displays (VFDs), have been recently studied and used in response to the various demands for the display devices.

A display device using an organic light emitting diode (OLED) is advantageous in that it has better luminance characteristic and viewing angle characteristic than a liquid crystal display, and has a ultra-thin profile because it does not require a backlight unit unlike the liquid crystal display.

SUMMARY OF THE INVENTION

In one aspect, there is provided a display device including a plurality of stand assemblies, a plurality of center frames correspondingly coupled to upper portions of the plurality of stand assemblies, and a plurality of display panels positioned on at least one side of the plurality of center frames, wherein at least a portion of the plurality of display panels are arranged to form a curved surface, and wherein two adjacent display panels of the plurality of display panels are arranged to form an overlap area wherein at least portions of the two adjacent display panels overlap each other.

A first display panel of the two adjacent display panels may include a first non-display area at a first side, a second display panel of the two adjacent display panels comprises a second non-display area at a second side, and the overlap area corresponds to an overlap between at least a portion of the first non-display area and at least a portion of the second non-display area.

A width of the first non-display area may be different from a width of the second non-display area.

A width of the first non-display area may be greater than a width of the second non-display area, and the first display panel is positioned in front of the second display panel.

The plurality of display panels may be arranged such that at least a portion of each display panel is positioned in front of at least a portion of an adjacent display panel to form a corresponding overlap area except a last positioned display panel of the plurality of display panels.

The display device may further include a deco coupled to at least one display panel of the plurality of display panels, wherein at least a portion of the deco is externally exposed.

The deco may be configured to extend toward a display surface of the at least one display panel and overlaps at least a portion of the display surface.

The display device may further include at least one bottom deco coupled to one or more display panels of the plurality of display panels at a side of the one or more display panels adjacent to the plurality of stand assemblies.

The at least one bottom deco may include a stepped configuration at a first side facing the plurality of display panels. Each step of the stepped configuration may correspond to an overlap area between two adjacent display panels.

A second side of the at least one bottom deco opposite the first side may include a continuous flat surface.

The curved surface of the at least a portion of the plurality of display panels may include at least one concave region and at least one convex region The display device may further include a plurality of stand covers correspondingly coupled to the plurality of stand assemblies and configured to shield the plurality of stand assemblies.

The plurality of stand covers may be arranged to form a curved surface corresponding to the curved surface of the at least a portion of the plurality of display panels.

The plurality of stand covers may form a flat surface regardless of a stepped portion of the plurality of display panels formed by the overlap area.

The plurality of display panels may include a first display panel having a concave display surface, and a second display panel having a convex display surface.

The first display panel may correspond to a first plurality of panels and the second display panel corresponds to a second plurality of panels and the second plurality of panels is positioned on the plurality of center frames after the first plurality of panels is positioned on the center frame.

The plurality of display panels may include a front display panel on a first side of the center frame, and a rear display panel on a second side of the center frame opposite the first side.

The plurality of display panels may be disposed such that a long side of a first display panel contacts a long side of an adjacent second display panel.

The plurality of display panels may be adjacently arranged each of the plurality of display panels is arranged with an adjacent display panel to include an overlapped portion, each of the plurality of display panels comprises a non-display border portion and the non-display border portion of a rear-most display panel of the adjacent display panels is covered from view by a corresponding overlapped portion.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
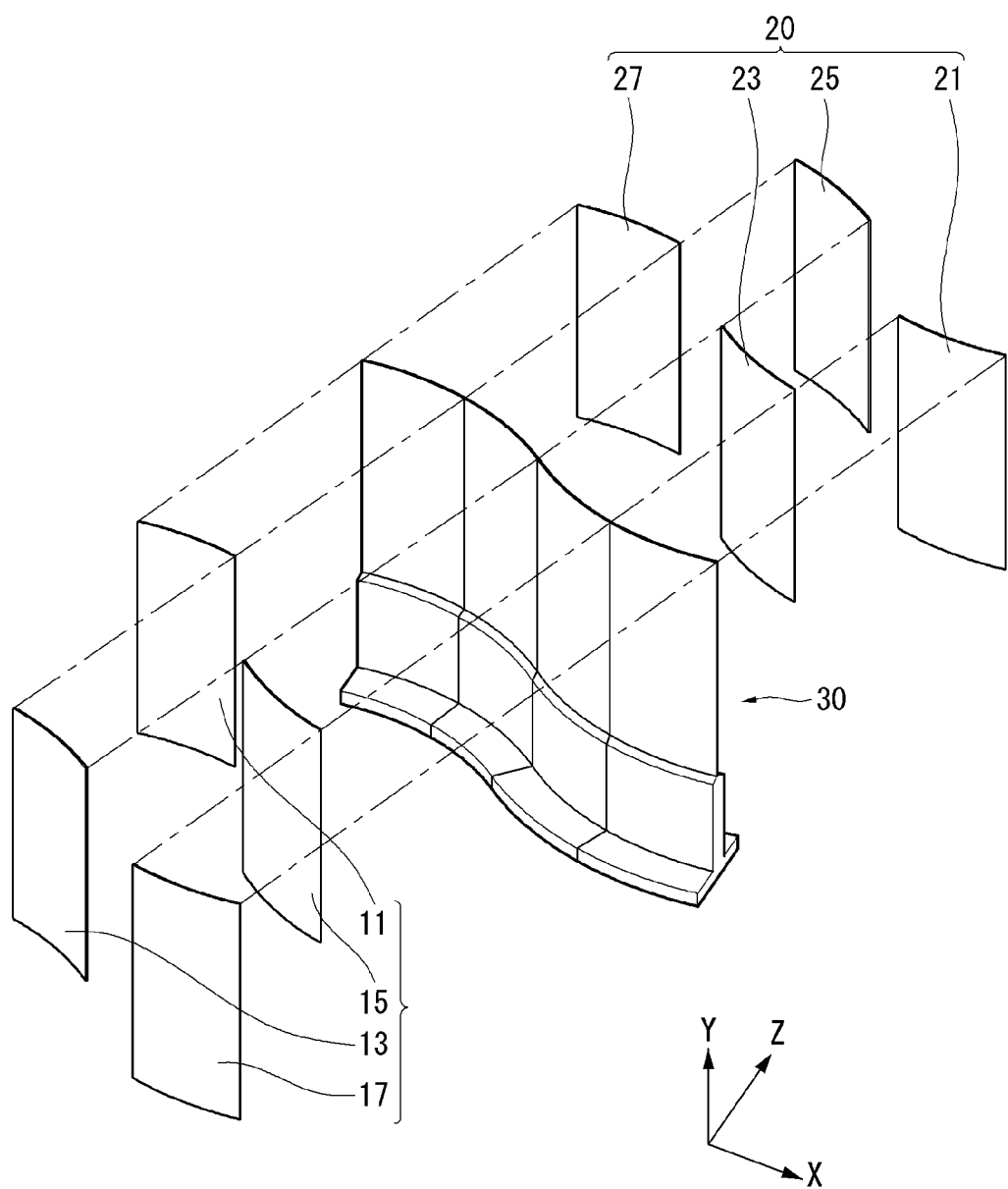
FIGS. 1, 2, 3A, 3B, 3C, 4A, 4B, 5A and 5B illustrate a display device according to an embodiment of the invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, embodiments of the invention are described using a liquid crystal display panel as an example of a display panel. Other display panels may be used. For example, a plasma display panel (PDP), a field emission display (FED) panel, and an organic light emitting diode (OLED) display panel may be used.

In what follows, a display panel may include a first long side, a second long side opposite the first long side, a first short side adjacent to the first long side and the second long side, and a second short side opposite the first short side.

In embodiments disclosed herein, the first short side may be referred to as a first side area; the second short side may be referred to as a second side area opposite the first side area; the first long side may be referred to as a third side area that is adjacent to the first side area and the second side area and is positioned between the first side area and the second side area; and the second long side may be referred to as a fourth side area that is adjacent to the first side area and the second side area, is positioned between the first side area and the second side area, and is opposite to the third side area.

Embodiments of the invention describe and illustrate that lengths of the first and second long sides are longer than lengths of the first and second short sides for the convenience of explanation. However, the lengths of the first and second long sides may be almost equal to the lengths of the first and second short sides.

In the following description, a first direction may be a direction parallel to the long sides of the display panel, and a second direction may be a direction parallel to the short sides of the display panel. Further, a third direction may be a direction vertical to the first direction and/or the second direction. The first direction and the second direction may be commonly referred to as a horizontal direction. Further, the third direction may be referred to as a vertical direction.

Further, a specific figure and/or specific contents of the specification may be replaced and combined with other figures and/or other contents of the specification unless they are incompatible.

FIGS. 1 to 5 illustrate a display device according to an embodiment of the invention.

As shown in FIGS. 1 to 5, a display device 1 according to an embodiment of the invention may include a plurality of panel assemblies 10 and 20, in which at least a portion is curved.

Figure 2:
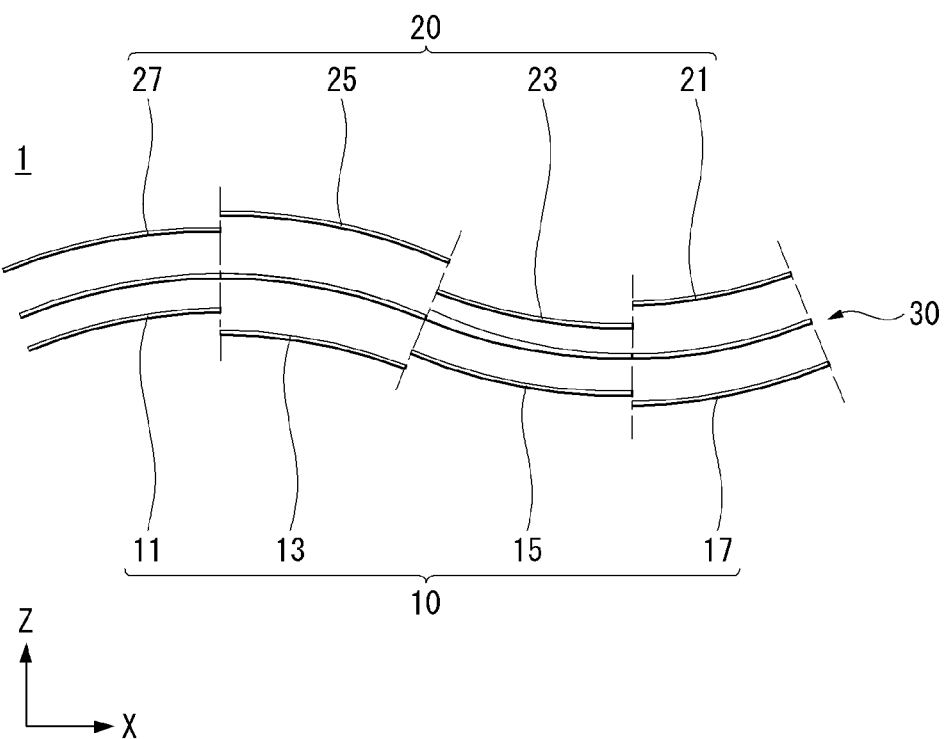

As shown in FIGS. 1 and 2, the display device 1 may include a frame (or a center frame) 30 and the panel assemblies 10 and 20 attached to the frame 30.

The frame 30 may be a component structurally supporting the display device 1. The frame 30 may be made of aluminum, so as to provide rigidity.

The frame 30 may be formed in a curved shape. For example, the frame 30 may be formed in at least one of a concave curved shape and/or a convex curved shape. For example, the frame 30 may be configured such that the frame 30 of the concave curved shape and the frame 30 of the convex curved shape are disposed.

The panel assemblies 10 and 20 may be formed in a curved shape. In other words, the panel assemblies 10 and 20 may be formed in a curved shape corresponding to the frame 30. In other words, the panel assemblies 10 and 20 may be formed in at least one of a concave curved shape and/or a convex curved shape.

The panel assemblies 10 and 20 may include a front panel 10 and a rear panel 20. The front panel 10 and the rear panel 20 may be positioned on one surface and the other surface of the frame 30. For example, the front panel 10 including first to fourth front panels 11, 13, 15, and 17 may be positioned on one surface of the frame 30, and the rear panel 20 including first to fourth rear panels 21, 23, 25, and 27 may be positioned on the other surface of the frame 30.

The panel assemblies 10 and 20 may be disposed such that their long sides are perpendicular to the ground. Namely, the panel assemblies 10 and 20 may be disposed such that their long sides are adjacent to each other in a longitudinal direction.

Alternatively, the panel assemblies 10 and 20 may be disposed such that their short sides are perpendicular to the ground. In this instance, it may be appropriate to display a long side of an image in a horizontal direction.

The panel assemblies 10 and 20 on one surface and the other surface of the frame 30 may have shapes corresponding to each other. For example, the first front panel 11 and the fourth rear panel 27 may have a concave shape and a convex shape corresponding to each other.

Because the panel assemblies 10 and 20 are disposed on one surface and the other surface of the frame 30 as described above, a displayed image may be observed at various positions. For example, when a panel is installed in a lobby such as an airport, an image can be effectively transferred.

As shown in FIGS. 3 and 4, the display device 1 may be configured in various forms.

Figure 3A:
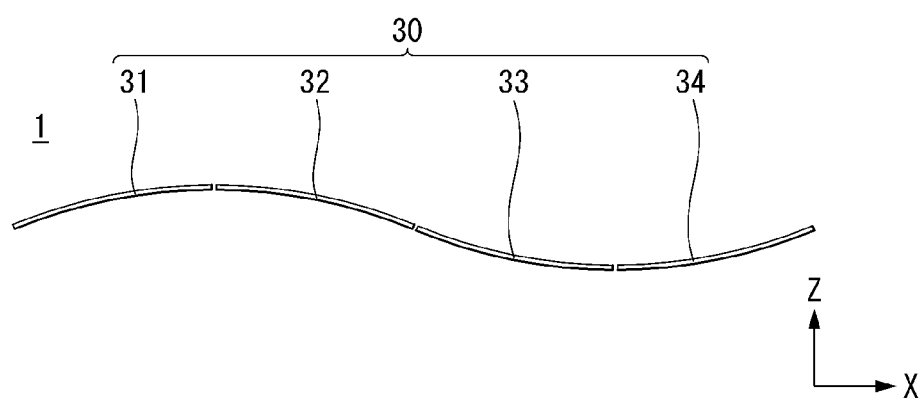

As shown in FIG. 3A, the display device 1 may have a shape based on first to fourth frames 31 to 34. For example, the third and fourth frames 33 and 34 of a concave shape may be positioned subsequent to the first and second frames 31 and 32 of a convex shape. In this instance, the display device 1 may have a wave shape.

Figure 3B:
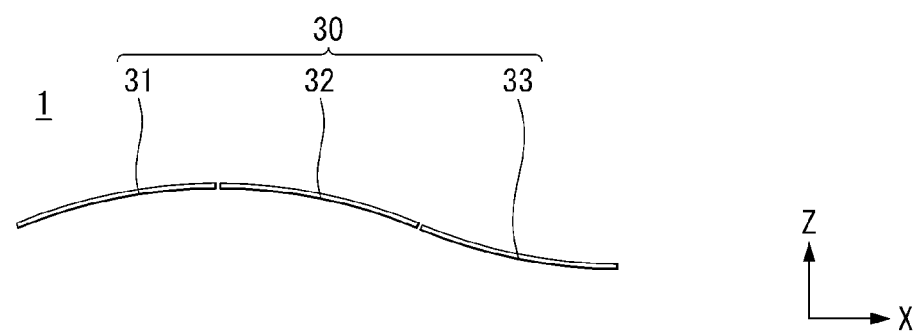

As shown in FIG. 3B, the display device 1 may have a shape based on first to third frames 31 to 33. For example, a plurality of convex-shaped frames 30 and a concave-shaped frame 30 may be coupled, or vice versa.

Figure 3C:
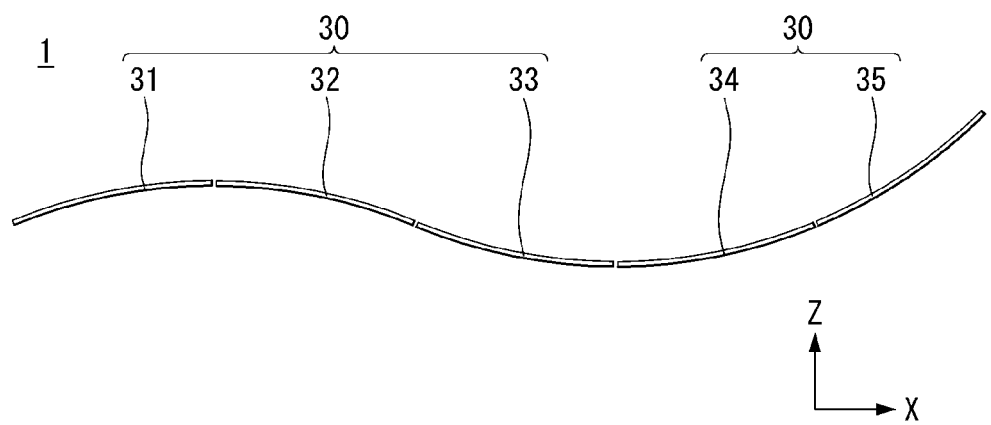

As shown in FIG. 3C, the display device 1 may be configured such that the number of concave-shaped frame 30 is different from the number of convex-shaped frame 30. Namely, the left and right sides of the display device 1 may be asymmetrical.

Figure 4A:
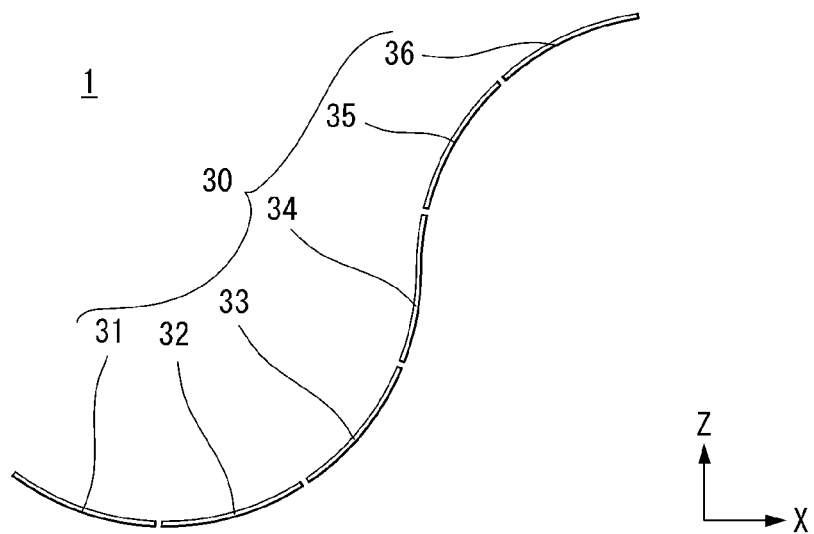
Figure 4B:
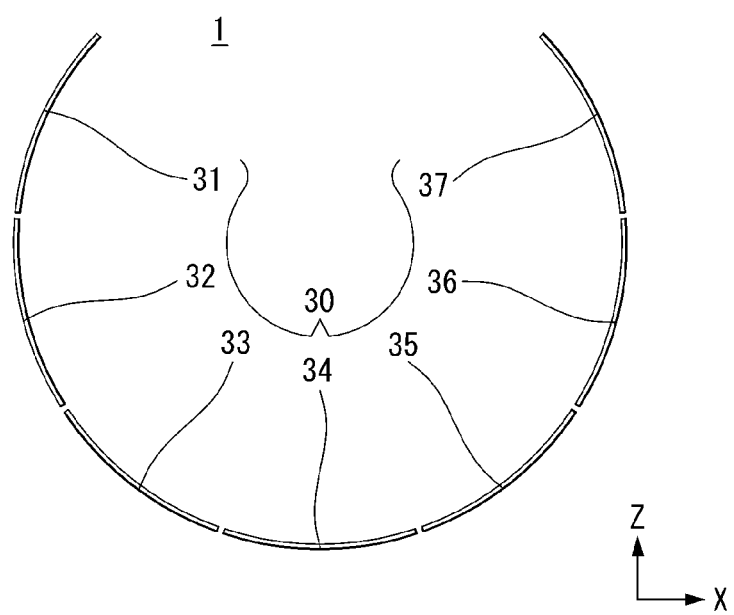

As shown in FIGS. 4A and 4B, at least a portion of the display device 1 may be disposed in a circular shape. Namely, a plurality of concave-shaped frames 30 may be successively disposed.

As shown in FIG. 4A, when first to fourth frames 31 to 34 of a concave shape are successively disposed, a portion of the display device 1 may be formed in a circular shape.

As shown in FIG. 4B, when frames 30 of the same shape are successively disposed, the display device 1 may be entirely formed in a circular shape.

As shown in 5A and 5B, at least a portion of the display device 1 according to the embodiment of the invention may be flat formed.

Figure 5A:
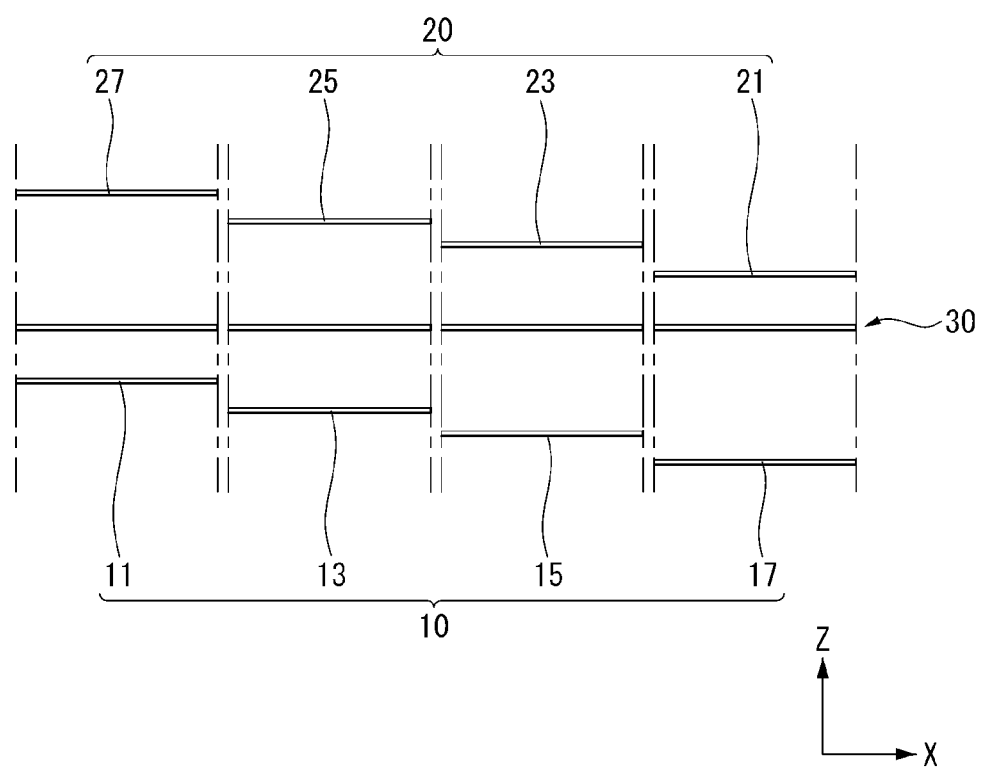

As shown in FIG. 5A, the display device 1 may be entirely formed in a flat shape. For example, panel assemblies 10 and 20 may be disposed on both side surfaces of a flat frame 30. The adjacent panel assemblies 10 and 20 may partially overlap each other. The panel assemblies 10 and 20 may be coupled in predetermined order in consideration of the overlapping.

Figure 5B:
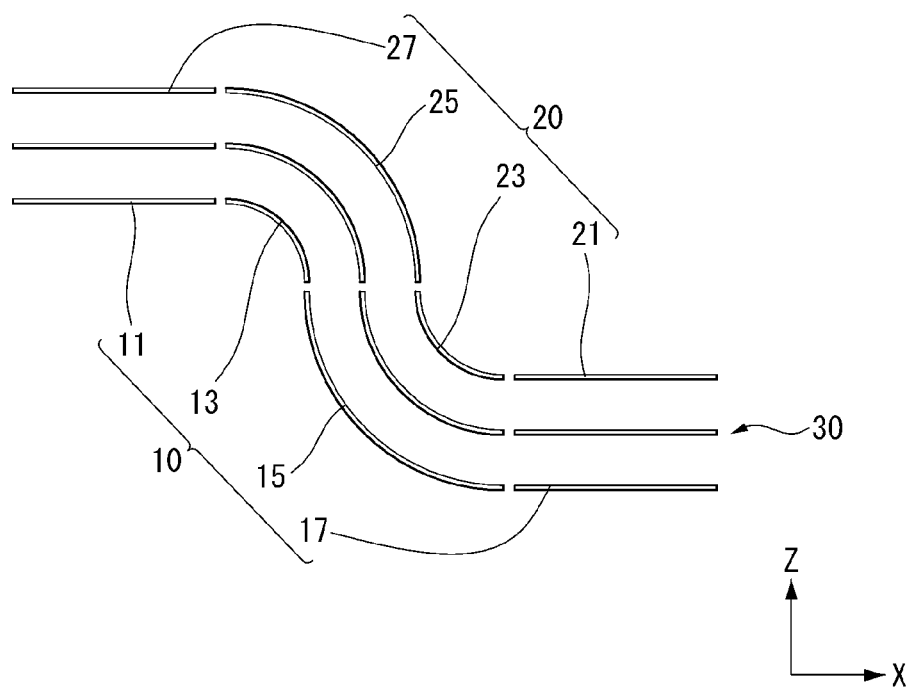

As shown in FIG. 5B, a portion of each of panel assemblies 10 and 20 may be in a flat shape, and another portion may be in a curved shape. For example, first and fourth front panels 11 and 17, first and fourth rear panels 21 and 27, and frames 30 corresponding to the first and fourth front and rear panels may have a flat shape. On the other hand, second and third front panels 13 and 15, second and third rear panels 23 and 25, and frames 30 corresponding to the second and third front and rear panels may have a curved shape.

FIGS. 6 to 15 illustrate configuration of a stand assembly of the display device according to the embodiment of the invention.

As shown in FIGS. 6 to 15, the display device 1 according to the embodiment of the invention may include a stand assembly 40 supporting the display device 1.

Figure 6:
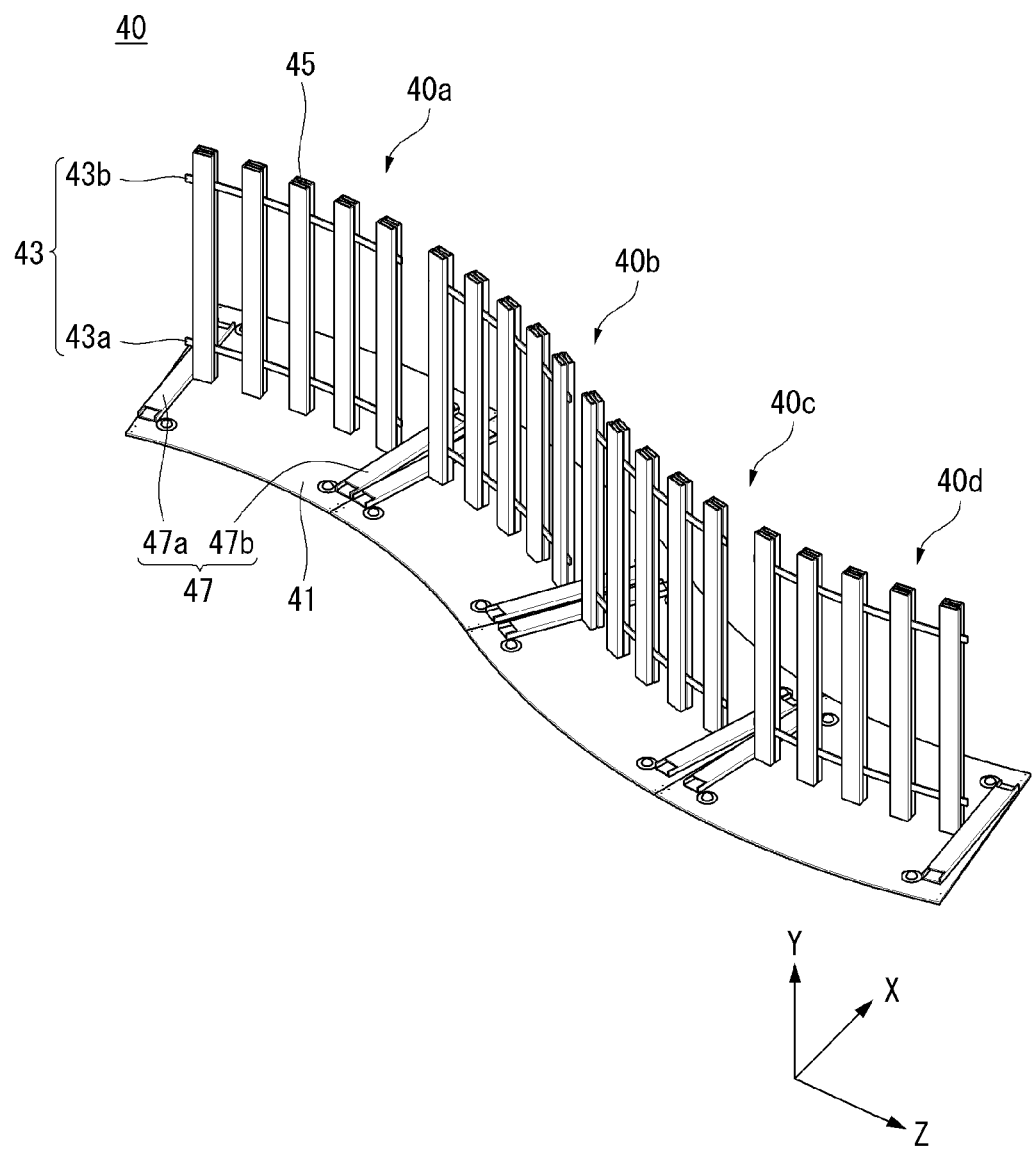
FIGS. 6, 7, 8, 9, 10, 11, 12A, 12B, 13, 14 and 15 illustrate configuration of a stand assembly of a display device according to an embodiment of the invention.
Figure 7:
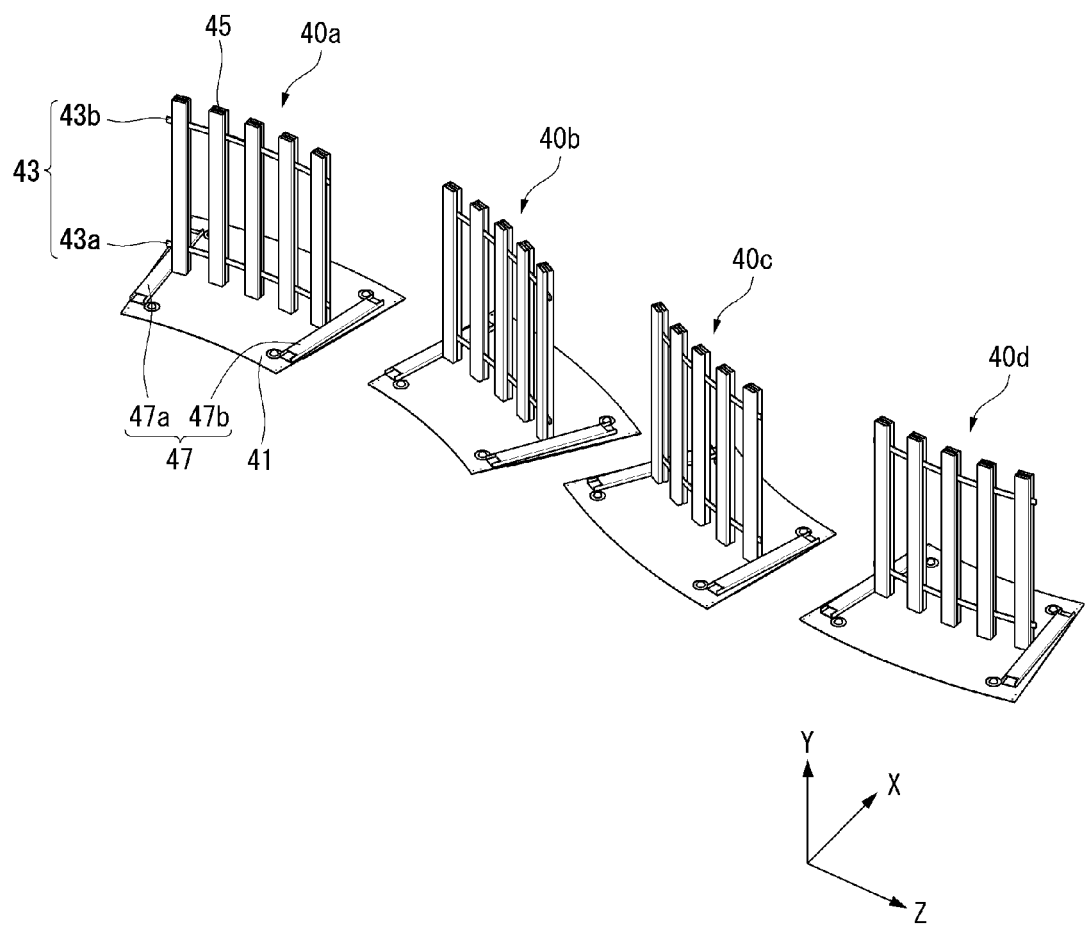

As shown in FIGS. 6 and 7, the stand assembly 40 may include a plurality of stand assemblies. For example, the stand assembly 40 may include first to fourth stand assemblies 40a to 40d.

The first to fourth stand assemblies 40a to 40d may be independently assembled. The independently assembled first to fourth stand assemblies 40a to 40d may be coupled to form one stand assembly 40. The first to fourth stand assemblies 40a to 40d may correspond to a specific location of the curved display device 1. In the following description, a description of one of the stand assembly 40 and the first to fourth stand assemblies 40a to 40d will be replaced with a description of the others because the stand assemblies 40 and 40a to 40d may have a difference only in a curved shape.

The stand assembly 40 may include a base 41, a stand frame 45 that is coupled to the base 41 and stands, a frame bar 43 coupled to the stand frame 45 in a transverse direction, and a base frame 47 on the base 41.

The base 41 may be formed in a plate shape. Namely, the base 41 may form a bottom surface of the stand assembly 40. The base 41 may include a plurality of through holes for coupling various components.

The stand frame 45 may be a bar coupled to the base 41 in a longitudinal direction. One end of the stand frame 45 may be coupled to the base 41, and the other end may upwardly face. The stand frame 45 may include first and second stand frames 45a and 45b (see FIG. 8).

The frame bar 43 may be coupled to the stand frame 45. In other words, the frame bar 43 may be transversely coupled to the stand frame 45 longitudinally coupled to the base 41. The frame bar 43 may be positioned between the first and second stand frames 45a and 45b. The frame bar 43 may strengthen rigidity of the stand frame 45. The frame bar 43 may have a curved shape corresponding to a disposition of the stand frame 45.

The base frame 47 may be coupled to a plane of the base 41. The base frame 47 coupled to the plane of the base 41 may provide rigidity for the base 41 so that the base 41 is not twisted. The base frame 47 may include first and second base frames 47a and 47b coupled to the base 41 along both sides of the base 41.

Figure 8:
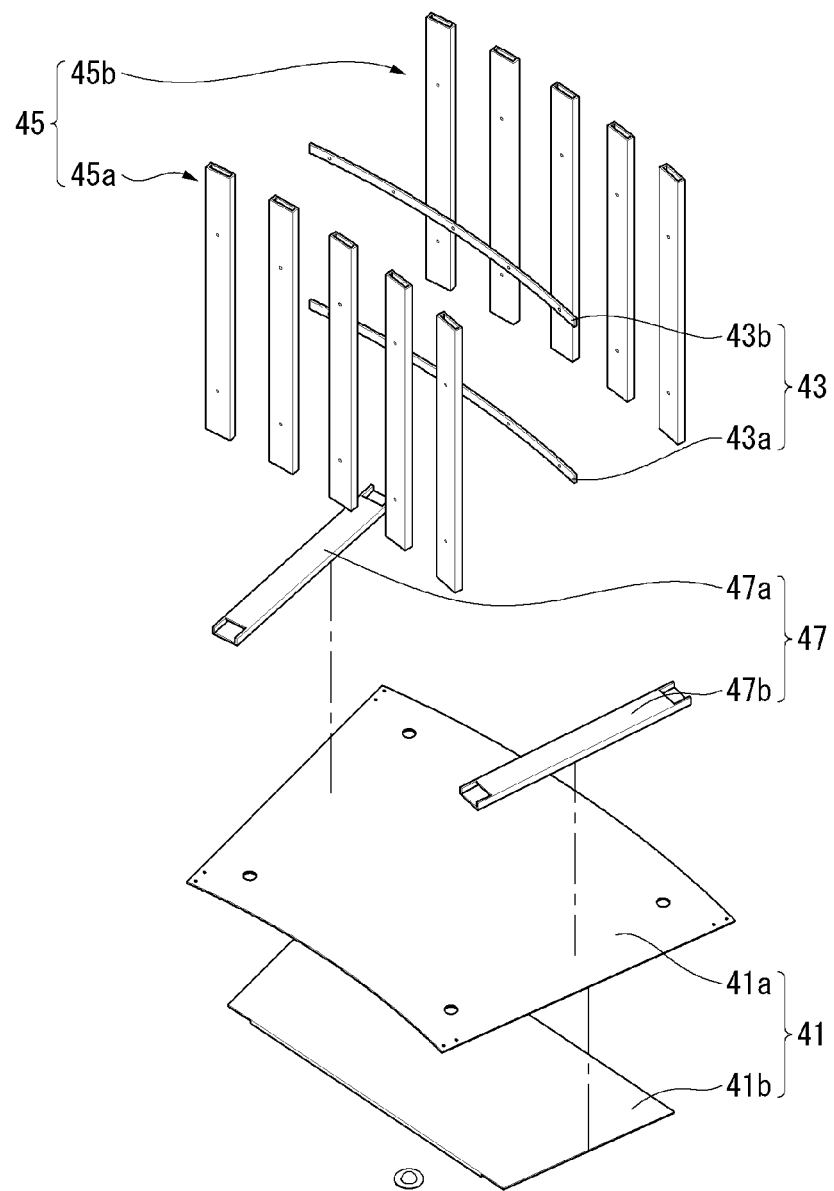
Figure 8:
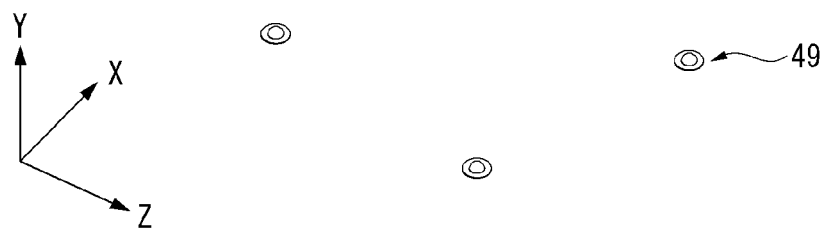

As shown in FIG. 8, the stand assembly 40 may include first and second frame bars 43a and 43b positioned between the first and second stand frames 45a and 45b. The first and second frame bars 43a and 43b may provide rigidity for a structure of the first and second stand frames 45a and 45b. The first and second frame bars 43a and 43b may make the first and second stand frames 45a and 45b be spaced apart from each other. The frame 30 may be inserted in a separation space formed by the first and second frame bars 43a and 43b.

The stand assembly 40 may include a ball caster 49.

The ball casters 49 may be coupled to a plurality of positions of a lower surface of the base 41, so as to support the stand assembly 40. The ball casters 49 may enable each stand assembly 40 to move. For example, a ball and/or a wheel included in the ball caster 49 may rotate and thus may change a position of the stand assembly 40.

The ball caster 49 may be coupled to the base 41. For example, the ball caster 49 may be coupled to the second base 41b underlying the first base 41a.

Figure 9:
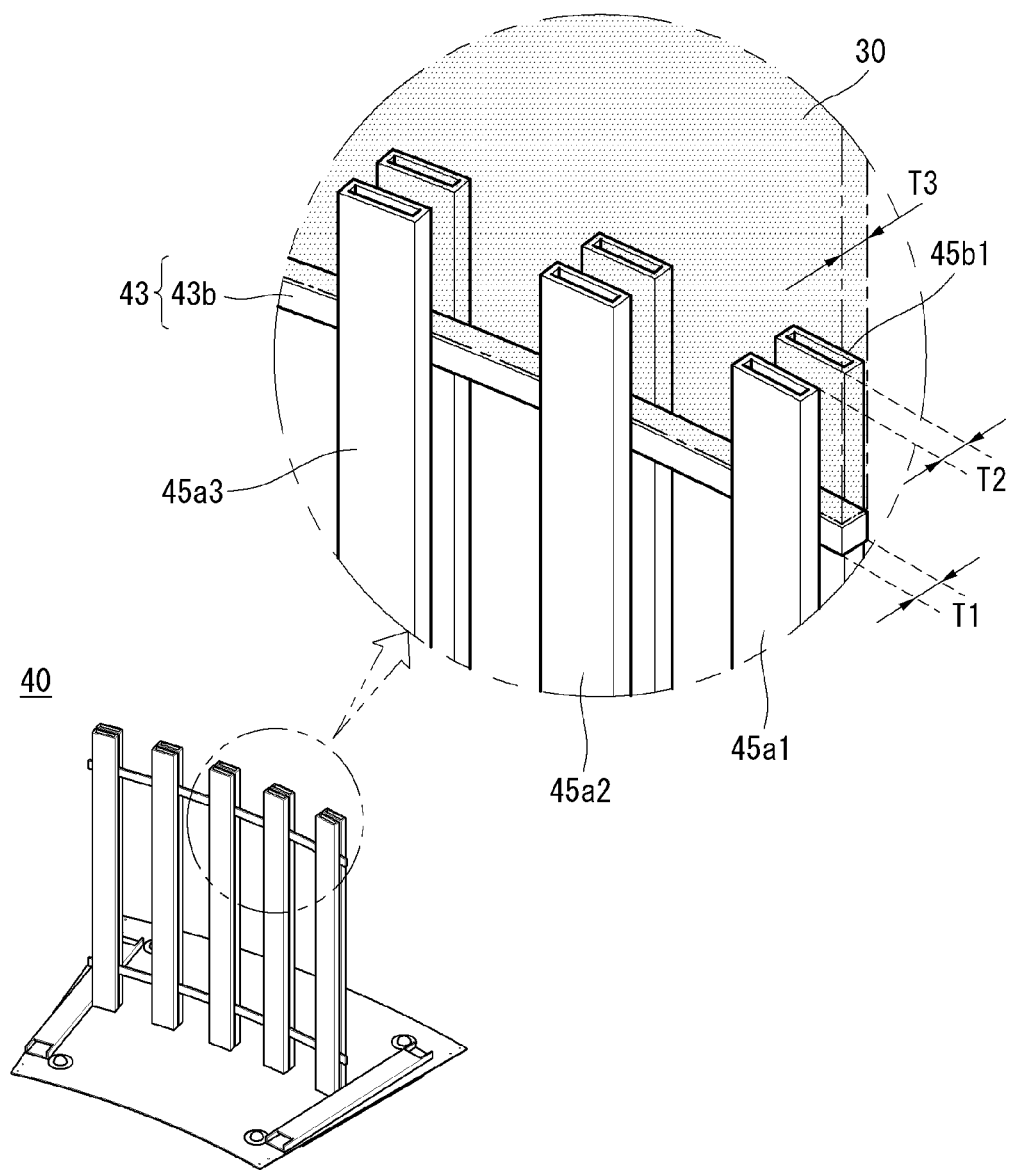

As shown in FIG. 9, the frame 30 may be coupled to the stand assembly 40. The frame 30 may be positioned between the first and second stand frames 45a and 45b. For example, the frame 30 may be positioned between 1a, 1b and 1c stand frames 45a1, 45a2 and 45a3 and 2a, 2b and 2c stand frames 45b1, 45b2 and 45b3.

The frame bar 43 may be positioned between the 1a, 1b and 1c stand frames 45a1, 45a2 and 45a3 and the 2a, 2b and 2c stand frames 45b1, 45b2 and 45b3. For example, the second frame bar 43b may be coupled to the 1a, 1b and 1c stand frames 45a1, 45a2 and 45a3 and the 2a, 2b and 2c stand frames 45b1, 45b2 and 45b3.

The second frame bar 43b may provide rigidity for the 1a, 1b and 1c stand frames 45a1, 45a2 and 45a3 and the 2a, 2b and 2c stand frames 45b1, 45b2 and 45b3 and form a frame coupling space (where the frame 30 will be disposed and coupled) between the 1a, 1b and 1c stand frames 45a1, 45a2 and 45a3 and the 2a, 2b and 2c stand frames 45b1, 45b2 and 45b3. For example, when the second frame bar 43b has a first thickness T1, and a distance between the 1a, 1b and 1c stand frames 45a1, 45a2 and 45a3 and the 2a, 2b and 2c stand frames 45b1, 45b2 and 45b3 is a second thickness T2, the first thickness T1 may be the same as the second thickness T2. The first and second thicknesses T1 and T2 may be equal to or greater than a thickness (i.e., a third thickness) T3 of the frame 30. Thus, the frame 30 may be fixed in a form to be placed on the second frame bar 43b.

Figure 10:
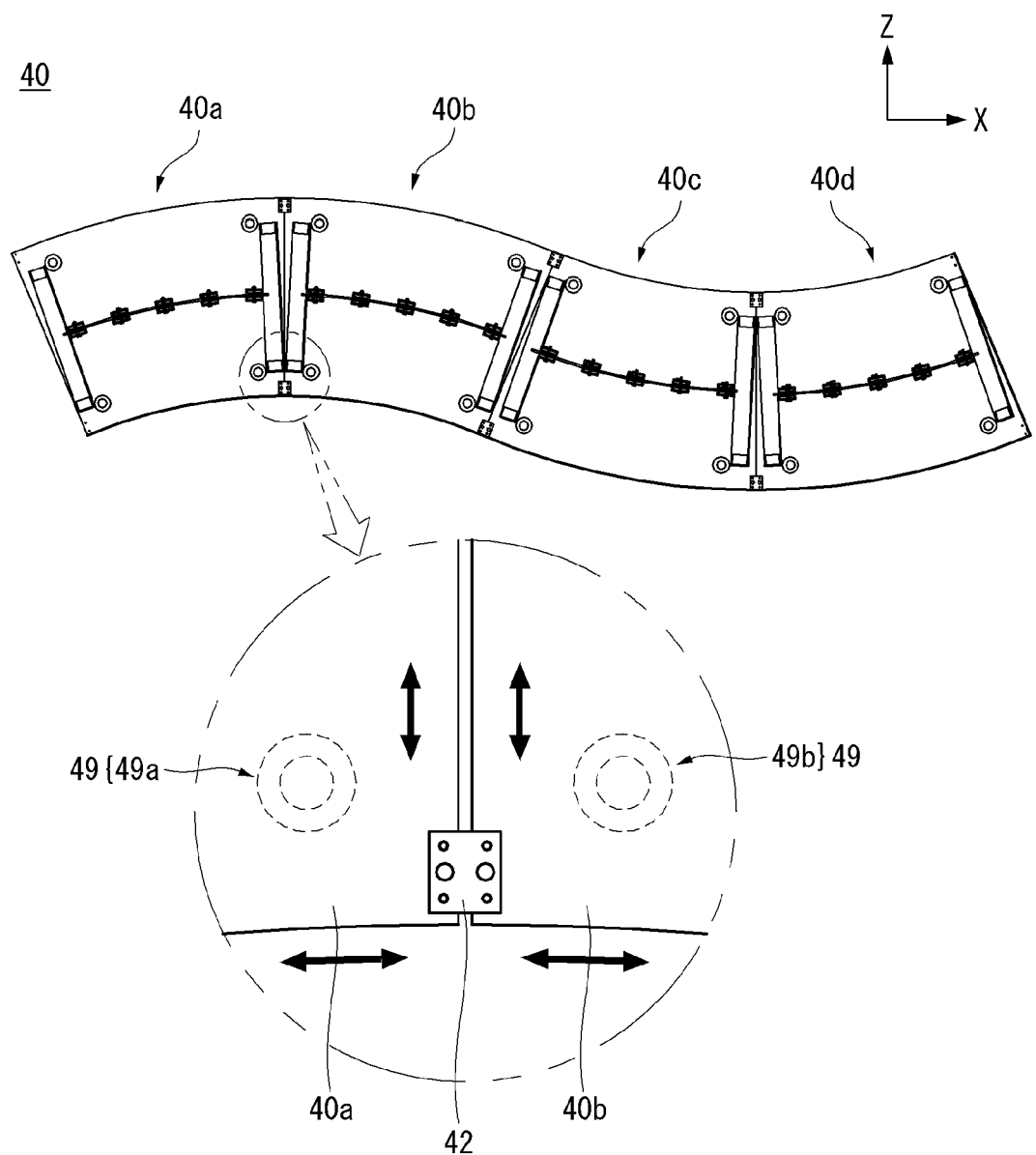
Figure 11:
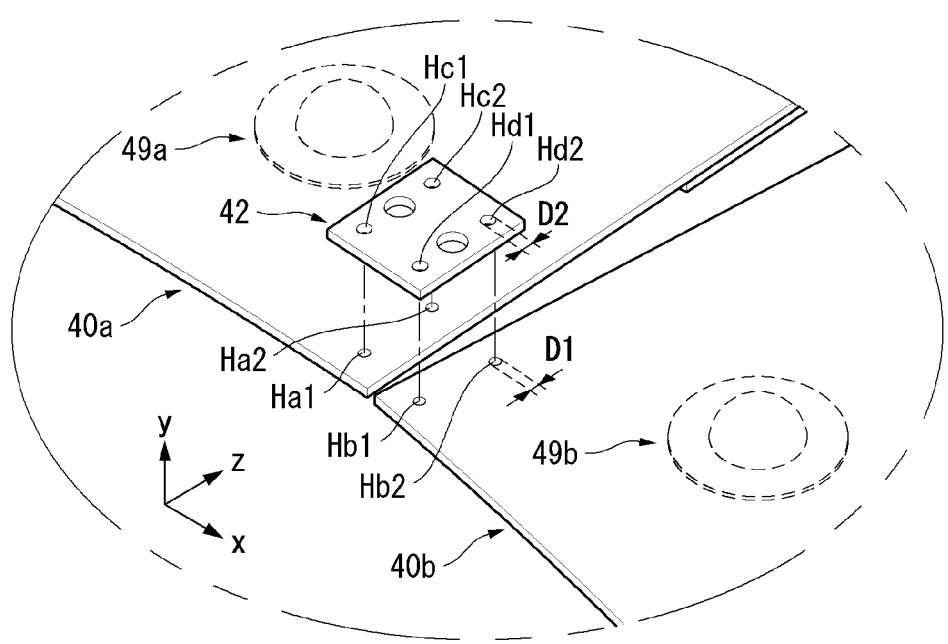

As shown in FIGS. 10 to 12, the stand assembly 40 of the display device 1 according to the embodiment of the invention may be fixed in a suitable form using the ball casters 49 and a fixer 42.

As shown in FIG. 10, the ball casters 49 may be coupled to bottom surfaces of the first to fourth stand assemblies 40a to 40d of the display device 1 according to the embodiment of the invention. The first to fourth stand assemblies 40a to 40d may adjust their position using the ball casters 49.

As shown in FIG. 11, an operator may dispose the first and second stand assemblies 40a and 40b adjacent to each other and then dispose the fixer 42.

The first and second stand assemblies 40a and 40b may include first to fourth stand coupling holes Ha1, Ha2, Hb1, and Hb2. The fixer 42 may include first to fourth fixer coupling holes Hc1, Hc2, Hd1, and Hd2. A first diameter D1 of each of the first to fourth stand coupling holes Ha1, Ha2, Hb1, and Hb2 may be less than a second diameter D2 of each of the first to fourth fixer coupling holes Hc1, Hc2, Hd1, and Hd2.

Figure 12A:
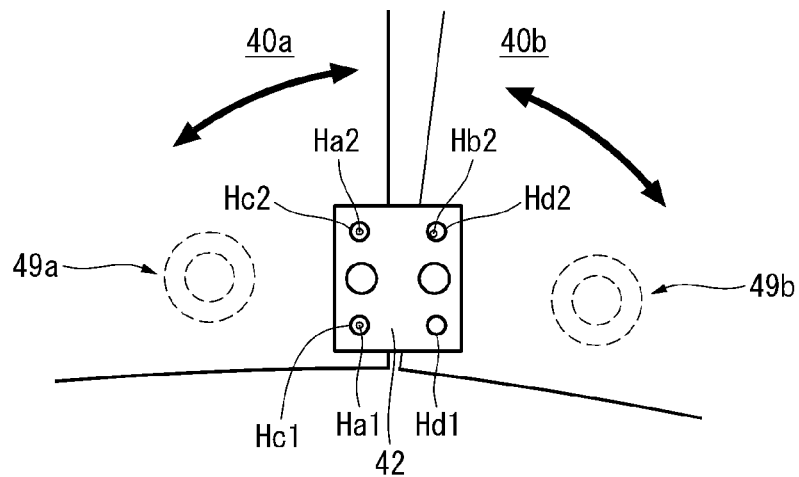

As shown in FIG. 12A, the first and second stand assemblies 40a and 40b may not be initially positioned in place. This may be perceived intuitively by the first to fourth stand coupling holes Ha1, Ha2, Hb1, and Hb2 observed through the first to fourth fixer coupling holes Hc1, Hc2, Hd1, and Hd2. For example, because the second stand assembly 40b is not positioned in place, the fourth stand coupling hole Hb2 observed through the fourth fixer coupling hole Hd2 may be out of position, and the third stand coupling hole Hb1 may not be observed through the third fixer coupling hole Hd1.

Figure 12B:
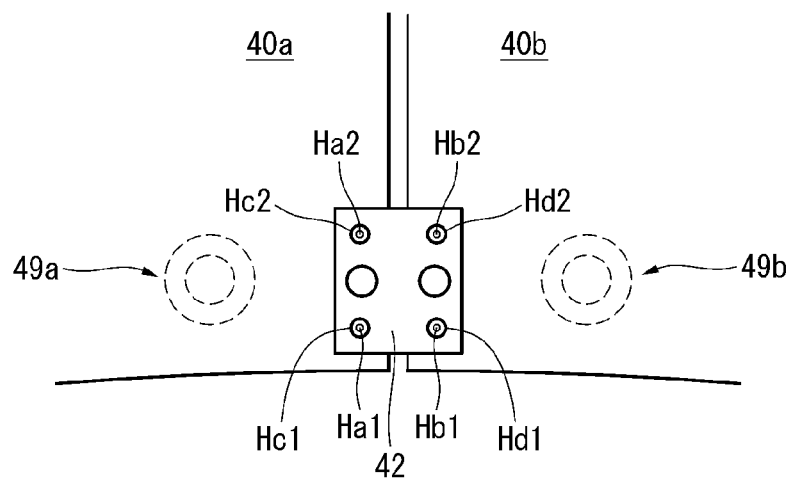

As shown in FIG. 12B, the operator may adjust the position of the first and second stand assemblies 40a and 40b. The position adjustment may be easily performed using ball casters 49a and 49b on the bottom surfaces of the first and second stand assemblies 40a and 40b.

The fact that the first and second stand assemblies 40a and 40b are positioned in place may be easily determined based on whether or not the first to fourth stand coupling holes Ha1, Ha2, Hb1, and Hb2 are respectively positioned in the center of the first to fourth fixer coupling holes Hc1, Hc2, Hd1, and Hd2. Namely, the operator may easily dispose the first and second stand assemblies 40a and 40b in place using the ball casters 49a and 49b and the fixer 42 without using a separate tool, etc.

Figure 13:
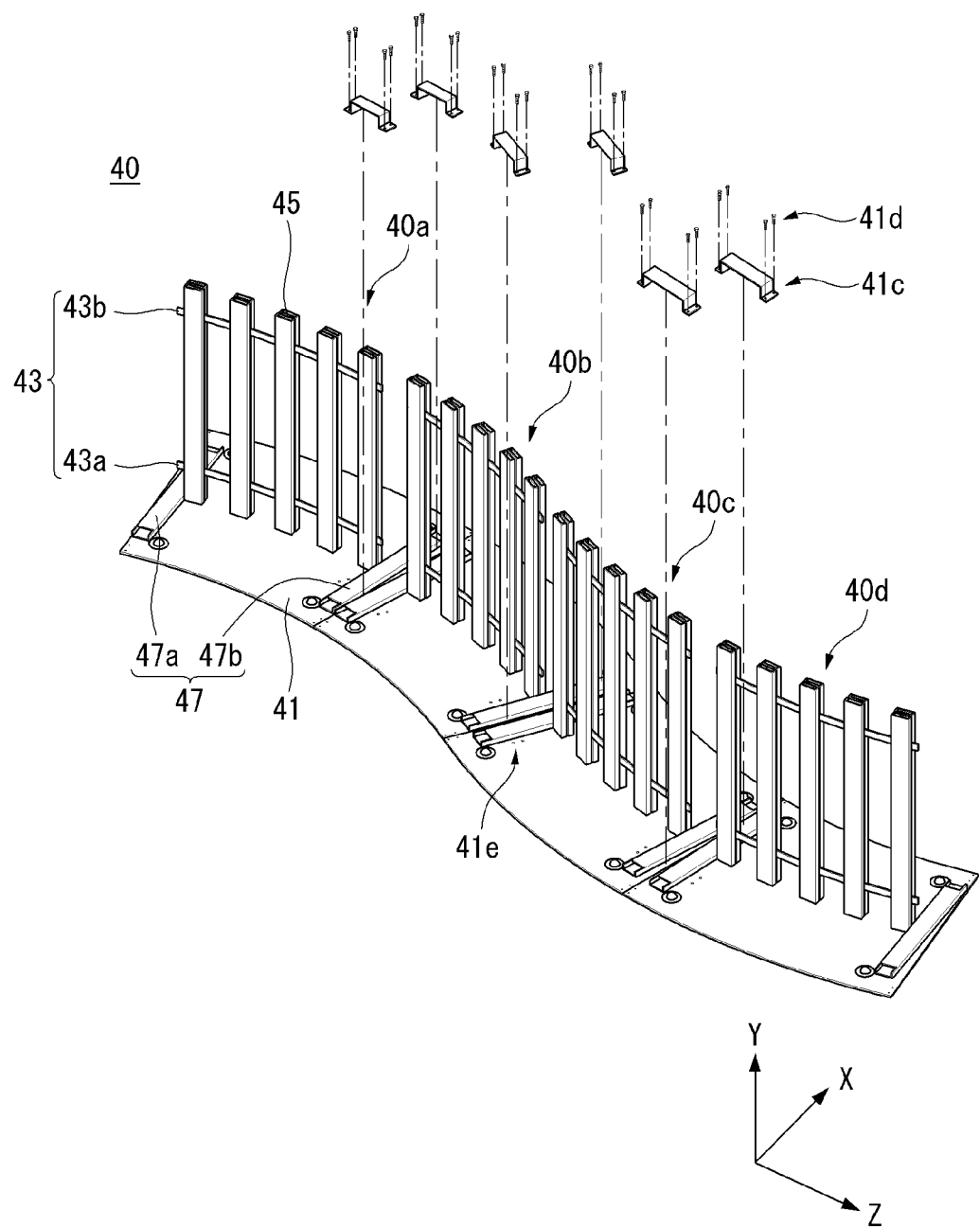

As shown in FIG. 13, a stand cover supporter 41c may be coupled to the base 141.

The stand cover supporter 41c may fix the two adjacent stand assemblies 40. For example, the stand cover supporter 41c may be coupled to the base 141 so that the first and second stand assemblies 40a and 40b are connected to each other. For example, a screw 41d may pass through the stand cover supporter 41c and a coupling hole 41e and may couple the stand cover supporter 41c to the base 141.

The plurality of stand cover supporters 41c may be used to connect the two adjacent stand assemblies 40. For example, the two stand cover supporters 41c may be positioned between the first and second stand assemblies 40a and 40b and coupled to them.

Figure 14:
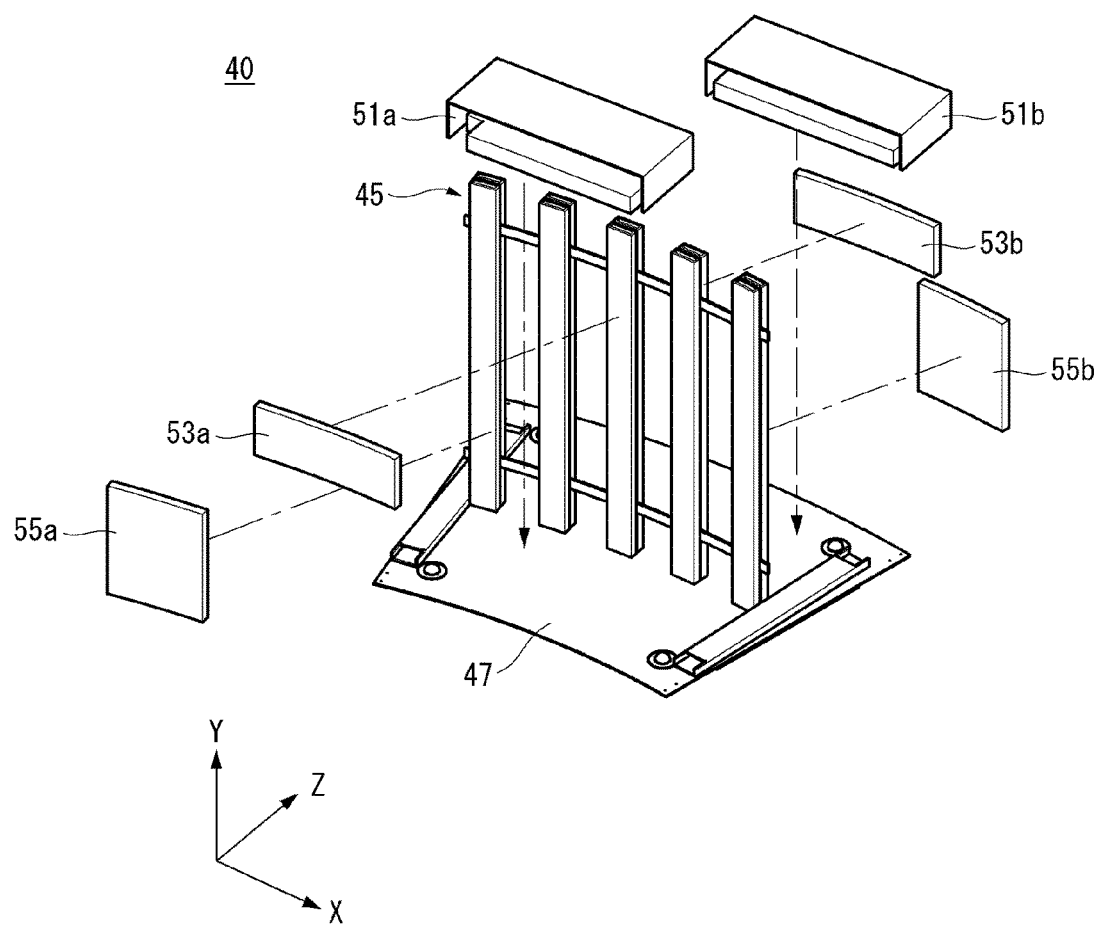
Figure 15:
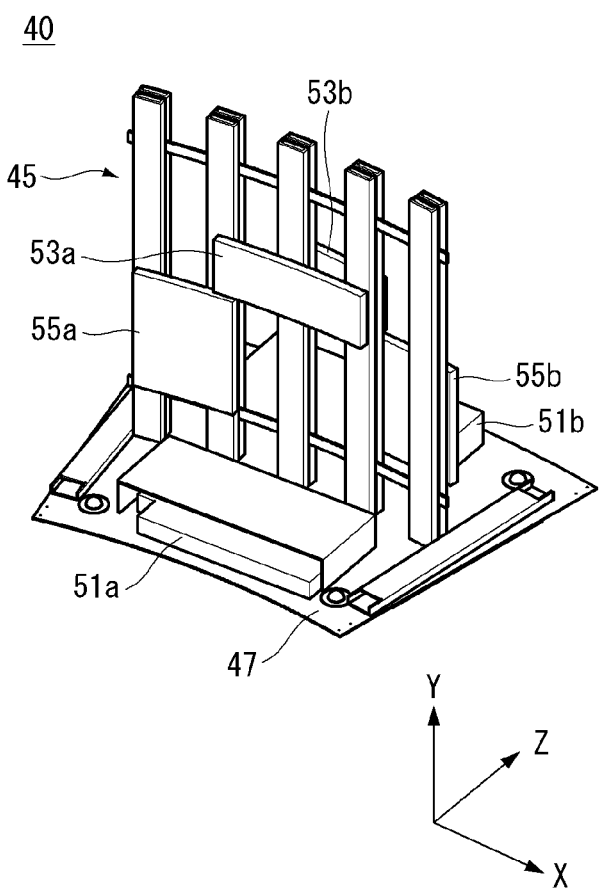

As shown in FIGS. 14 and 15, the components of the display device 1 may be coupled to the stand assembly 40. The component of the display device 1 may include an electronic unit supplying electrical signals and/or electric power. The panel assemblies 10 and 20 (see FIG. 26) displaying an image of the display device 1 may be configured to be relatively thin. The panel assemblies 10 and 20 (see FIG. 26) may be formed in a thin and beautiful shape by applying an organic light emitting diode (OLED) display panel by way of example. Thus, the components necessary for an operation of the panel assemblies 10 and 20 (see FIG. 26) may be disposed at the stand assembly 40.

The component of the display device 1 may be coupled to the stand assembly 40 at different positions. For example, a portion of the component may be coupled to the stand frame 45, and another portion of the component may be disposed on the base frame 47 in accordance with characteristics of the component.

The components of the display device 1 may be disposed in both side areas of the stand frame 45. The display device 1 may include the first and second panel assemblies 10 and 20. Namely, the display device 1 may include the first panel assembly 10 facing one side and the second panel assembly 20 facing the other side. Thus, a component corresponding to the first panel assembly 10 may be disposed in one side area, and a component corresponding to the second panel assembly 20 may be disposed in the other side area. Namely, components 51a, 53a, and 55a corresponding to the first panel assembly 10 may be disposed in one side area, and components 51b, 53b, and 55b corresponding to the second panel assembly 20 may be disposed in the other side area.

The components of the display device 1 may include power units 51a and 51b, T-con units 53a and 53b, and printed circuit board (PCB) units 55a and 55b. The components may be attached to the stand frame 45 or attached to the base frame 47. Such an arrangement of the components may be to minimize a width, a length, and/or a volume of the stand assembly 40. For example, the T-con units 53a and 53b and/or the PCB units 55a and 55b having a relatively large area may be attached to the stand frame 45. When the component having a relatively large area is longitudinally disposed on the stand frame 45, a width of the Z-X plane of the base frame 47 can be prevented from being increased. Such an arrangement of the components may be to minimize a noise that may occur between the panel assemblies 10 and 20 and the components exchanging signals with the panel assemblies 10 and 20. For example, the T-con units 53a and 53b and/or the PCB units 55a and 55b may transmit an image signal to the panel assemblies 10 and 20. When a transmission path of the image signal becomes longer, a likelihood of occurrence of the noise may increase. Thus, the T-con units 53a and 53b and/or the PCB units 55a and 55b may be disposed on the stand frame 45 near to the panel assemblies 10 and 20. Such an arrangement may be to minimize interference between operations of the components. For example, the power units 51a and 51b generating heat may be attached to the base frame 47. By disposing the power units 51a and 51b at a distance from other components, the power units 51a and 51b can smoothly dissipate heat. Further, an influence of the heat dissipation on other components can be reduced.

FIGS. 16 to 25 illustrate configuration of a center frame assembly according to the embodiment of the invention.

As shown in FIGS. 16 to 25, the display device 1 according to the embodiment of the invention may include a center frame assembly 30. The center frame assembly 30 may be a component, to which the panel assemblies 10 and 20 (see FIG. 26) of the display device 1 are coupled. The center frame assembly 30 may guide the panel assemblies 10 and 20 to maintain a curved shape.

Figure 16:
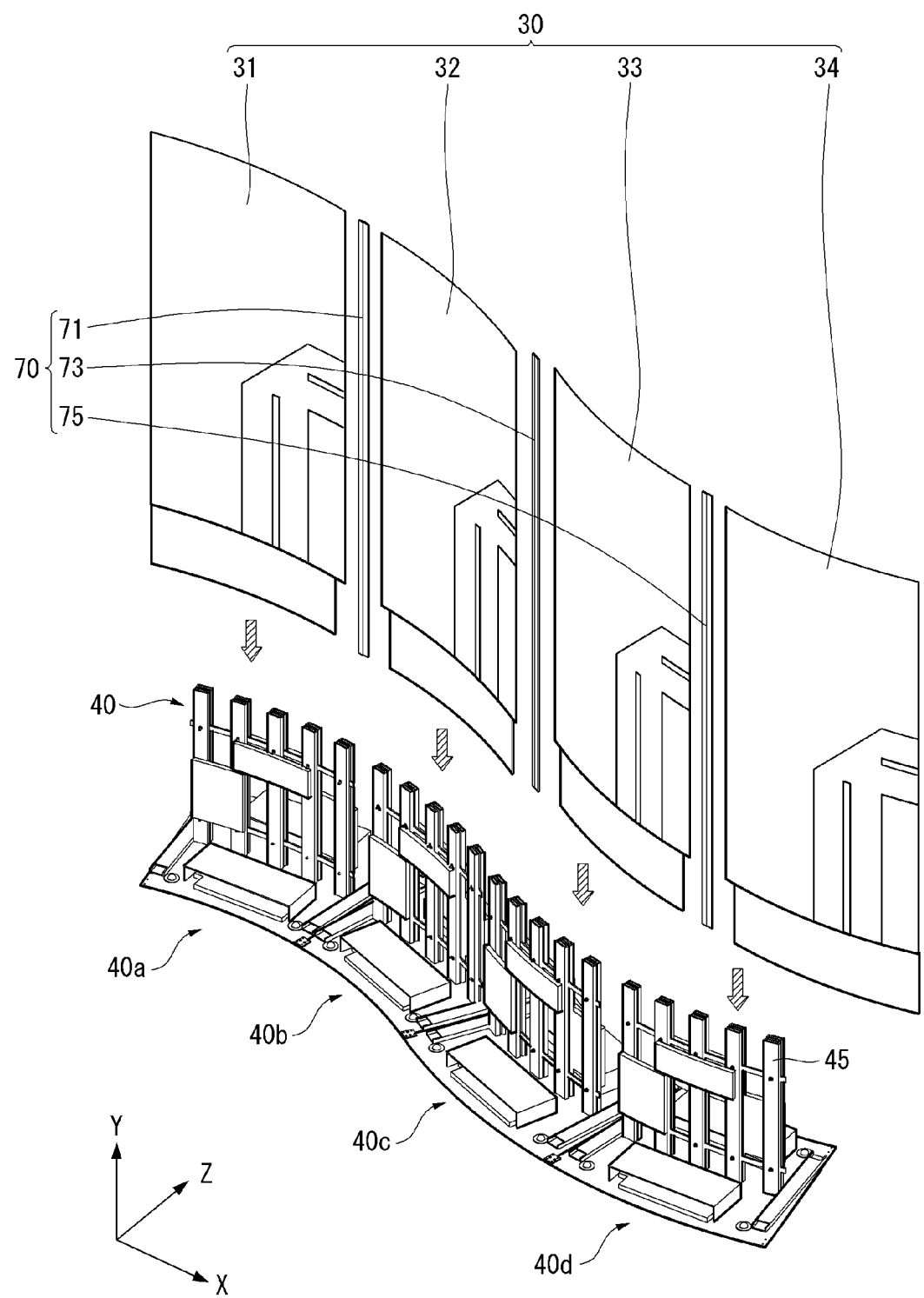
FIGS. 16, 17, 18, 19A, 19B, 20, 21, 22, 23, 24A, 24B, 24C, 25A and 25B illustrate configuration of a center frame assembly according to an embodiment of the invention.

As shown in FIG. 16, the center frame assembly 30 may include first to fourth center frames 31 to 34. The first to fourth center frames 31 to 34 may be formed in a curved shape. For example, the first and second center frames 31 and 32 may be formed in a concave curved shape, and the third and fourth center frames 33 and 34 may be formed in a convex curved shape.

The first to fourth center frames 31 to 34 may be coupled to the first to fourth stand assemblies 40a to 40d. For example, the first to fourth center frames 31 to 34 may be coupled to upper sides of the stand frames 45 of the first to fourth stand assemblies 40a to 40d.

A center frame bracket 70 may be coupled to a long side of the center frame assembly 30. For example, a first center frame bracket 71 may be positioned between the first and second center frames 31 and 32; a second center frame bracket 73 may be positioned between the second and third center frames 32 and 33; and a third center frame bracket 75 may be positioned between the third and fourth center frames 33 and 34. Each center frame bracket 70 may fix the adjacent center frames 30.

Figure 17:
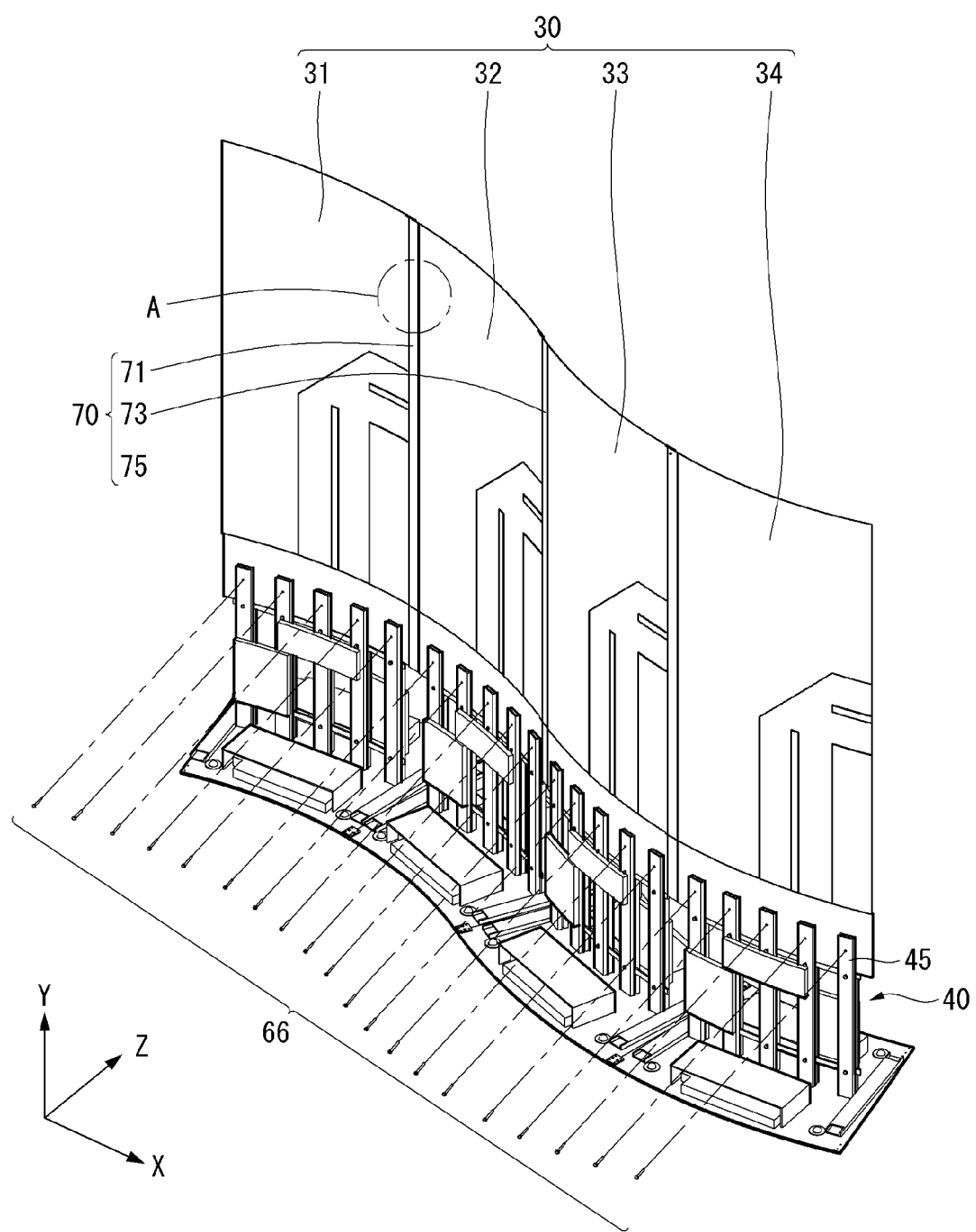

As shown in FIG. 17, after the center frame 30 is temporarily fixed to the stand frame 45, the center frame 30 may be firmly fixed to the stand frame 45 using a coupling means such as a bolt 66.

Figure 18:
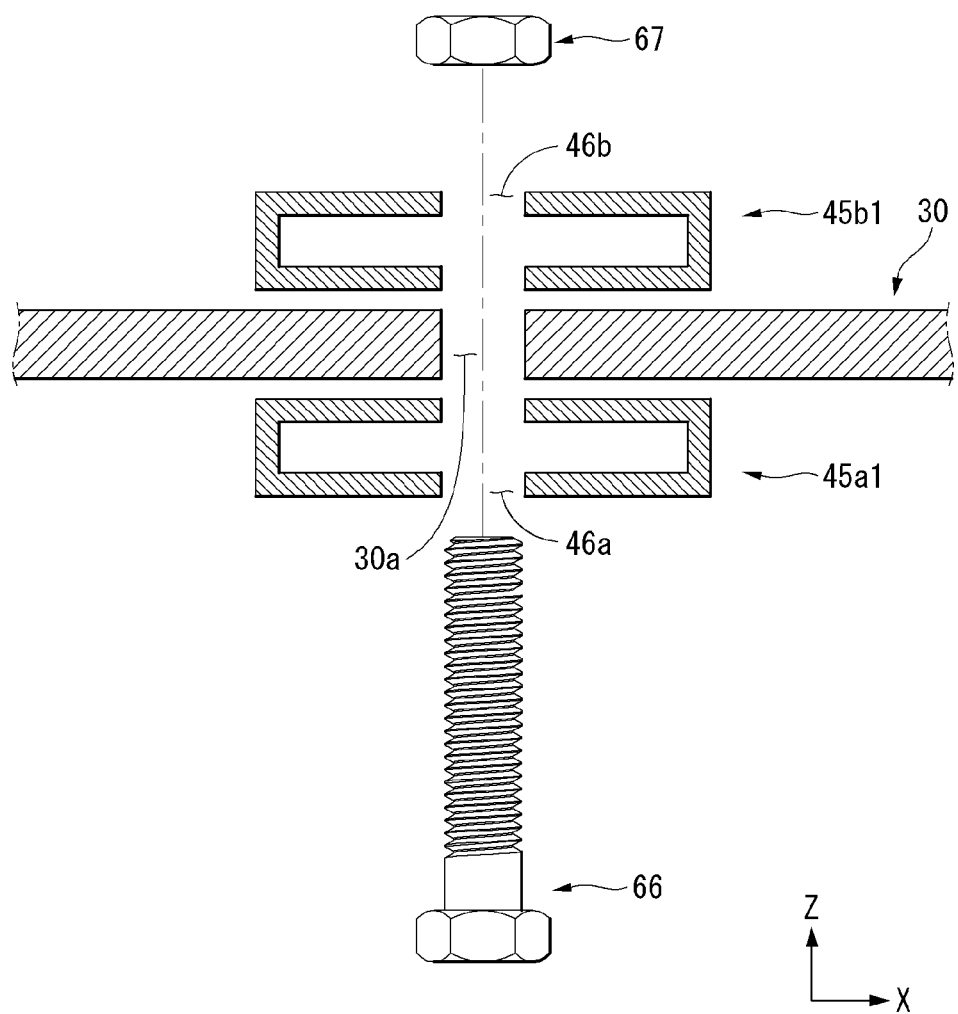

As shown in FIG. 18, first, second, and third through holes 46a, 46b, and 30a communicating with one another may be formed in the 1a and 2a stand frames 45a1 and 45b1 and the center frame 30. The bolt 66 may pass through the first, second, and third through holes 46a, 46b, and 30a and may be coupled to a nut 67.

Figure 19A:
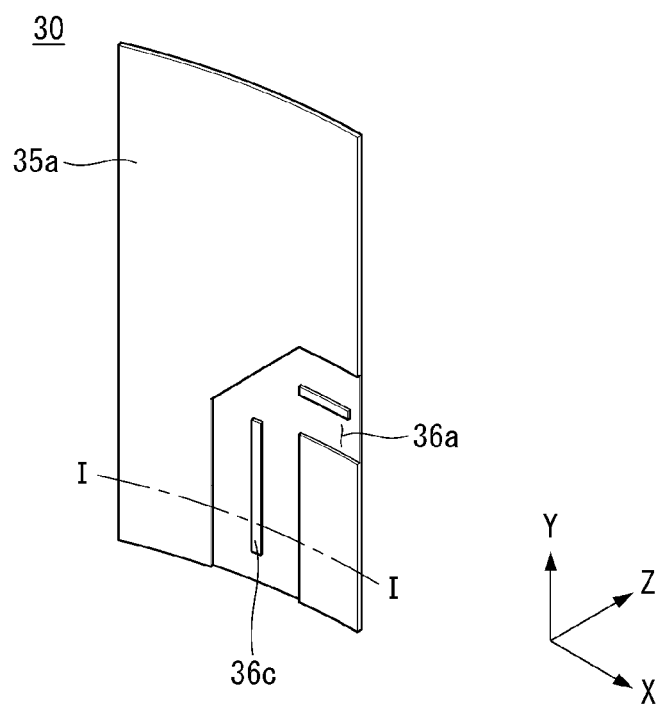
Figure 19B:
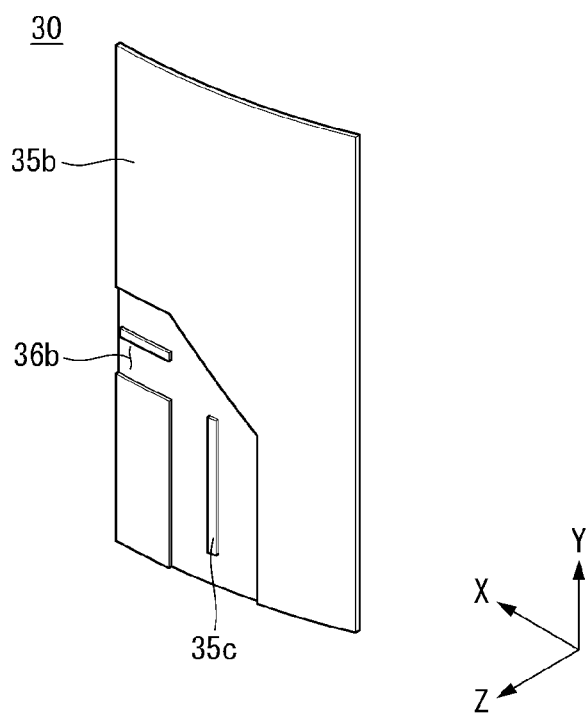
Figure 20:
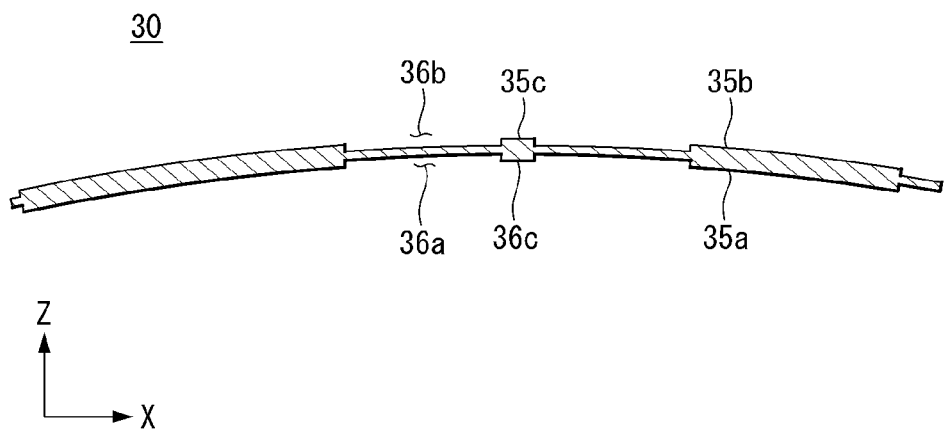

As shown in FIGS. 19A, 19B and 20, the center frame 30 may have a shape corresponding to the shape of the panel assemblies 10 and 20 that will be coupled to the center frame 30.

As shown in FIGS. 19A and 19B, a first groove 36a and a second groove 36b may be respectively formed on a first surface 35a and a second surface 35b of the center frame 30. The first and second grooves 36a and 36b may be formed by more depressing a portion of each of the first and second surfaces 35a and 35b than another portion.

The first and second grooves 36a and 36b may correspond to a back structure of the panel assemblies 10 and 20. For example, the first and second grooves 36a and 36b may be an area of the panel assemblies 10 and 20 corresponding to a cable connected to the T-con units 53a and 53b, the PCB units 55a and 55b, and/or the power units 51a and 51b.

As shown in FIG. 20, the first groove 36a may be formed on the first surface 35a, and the second groove 36b may be formed on the second surface 35b. The first groove 36a may be positioned corresponding to the second groove 36b.

First and second protrusions 35c and 36c may be positioned on the first and second grooves 36a and 36b. The first and second protrusions 35c and 36c may have a height corresponding to the first and second surfaces 35a and 35b. Namely, the first and second protrusions 35c and 36c may have a shape protruding from bottom surfaces of the first and second grooves 36a and 36b.

Figure 21:
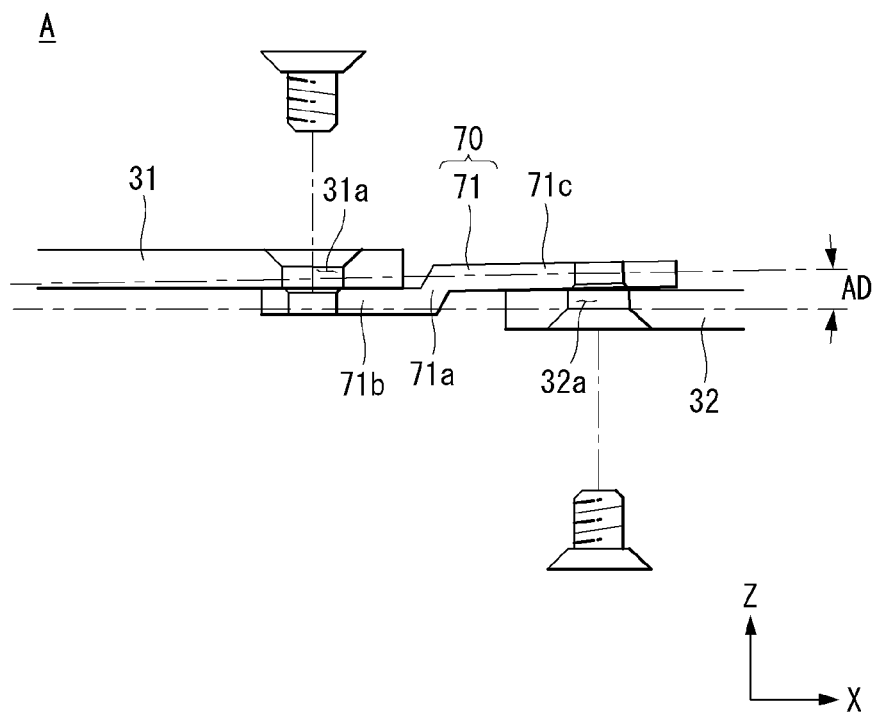
Figure 22:
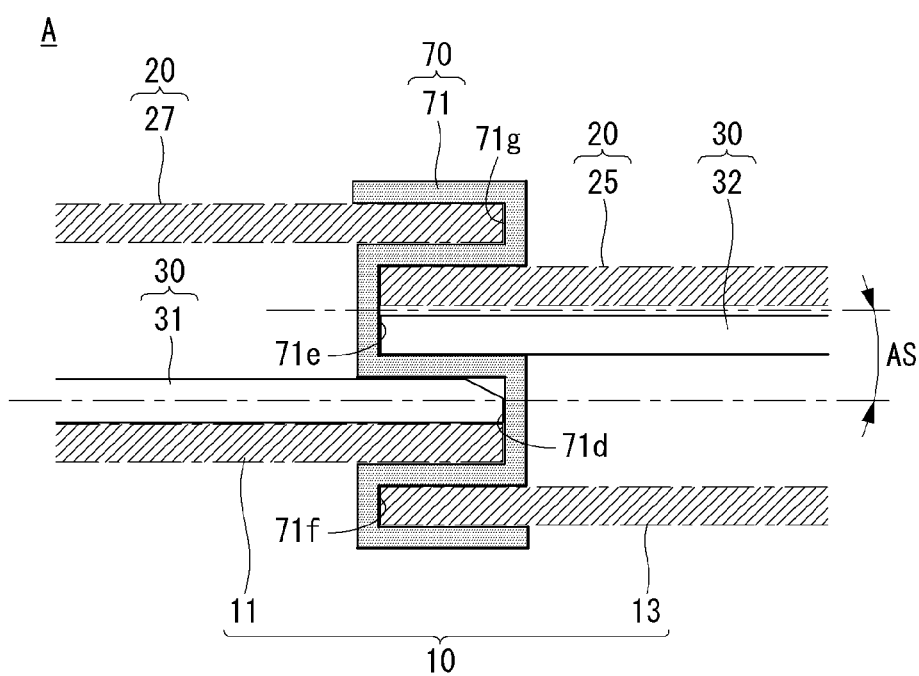

As shown in FIGS. 21 and 22, the center frame bracket 70 may connect the center frames 30. The plurality of center frame brackets 70 may have similar shapes. Thus, in the following description, a description of the first center frame bracket 71 will be replaced with a description of other center frame brackets 70.

As shown in FIG. 21, the first center frame bracket 71 may connect the first frame 31 and the second frame 32.

The first center frame bracket 71 may include a refractive portion 71a and first and second connection portions 71b and 71c extended from both sides of the refractive portion 71a.

The first and second connection portions 71b and 71c may not be parallel to each other. Namely, a second imaginary plane formed by the second connection portion 71c may be inclined to a first imaginary plane formed by the first connection portion 71b at a predetermined angle. Because the second connection portion 71c is inclined to the first connection portion 71b, the first and second frames 31 and 32 coupled to the first and second connection portions 71b and 71c may form an inclination angle AD. The inclination angle AD may serve to make the first and second frames 31 and 32 naturally curved. The first and second connection portions 71b and 71c may be coupled to the first and second frames 31 and 32 by bolts coupled to the first and second connection portions 71b and 71c and through holes 31a and 32a of the first and second frames 31 and 32.

As shown in FIG. 22, the center frame bracket 70 may be configured to simultaneously couple the frame 30 to the panel assemblies 10 and 20. For example, a related configuration may be coupled to a plurality of depressions formed in at least a portion of the center frame bracket 70.

The first frame 31 and the first front panel 11 may be coupled to a first depression 71d of the first center frame bracket 71. Namely, an inner space of the first depression 71d may correspond to a sum of the first frame 31 and the first front panel 11. Similarly, the second frame 32 and the third rear panel 25 may be coupled to a second depression 71e of the first center frame bracket 71. The second front panel 13 and the fourth rear panel 27 may be coupled to third and fourth depressions 71f and 71g of the first center frame bracket 71, respectively.

The depressions 71d, 71e, 71f and 71g may be inclined at a predetermined angle. Namely, the depressions 71d, 71e, 71f and 71g may form an inclination angle AS and serve to make the frame 30 and the panel assemblies 10 and 20 naturally curved.

Figure 23:
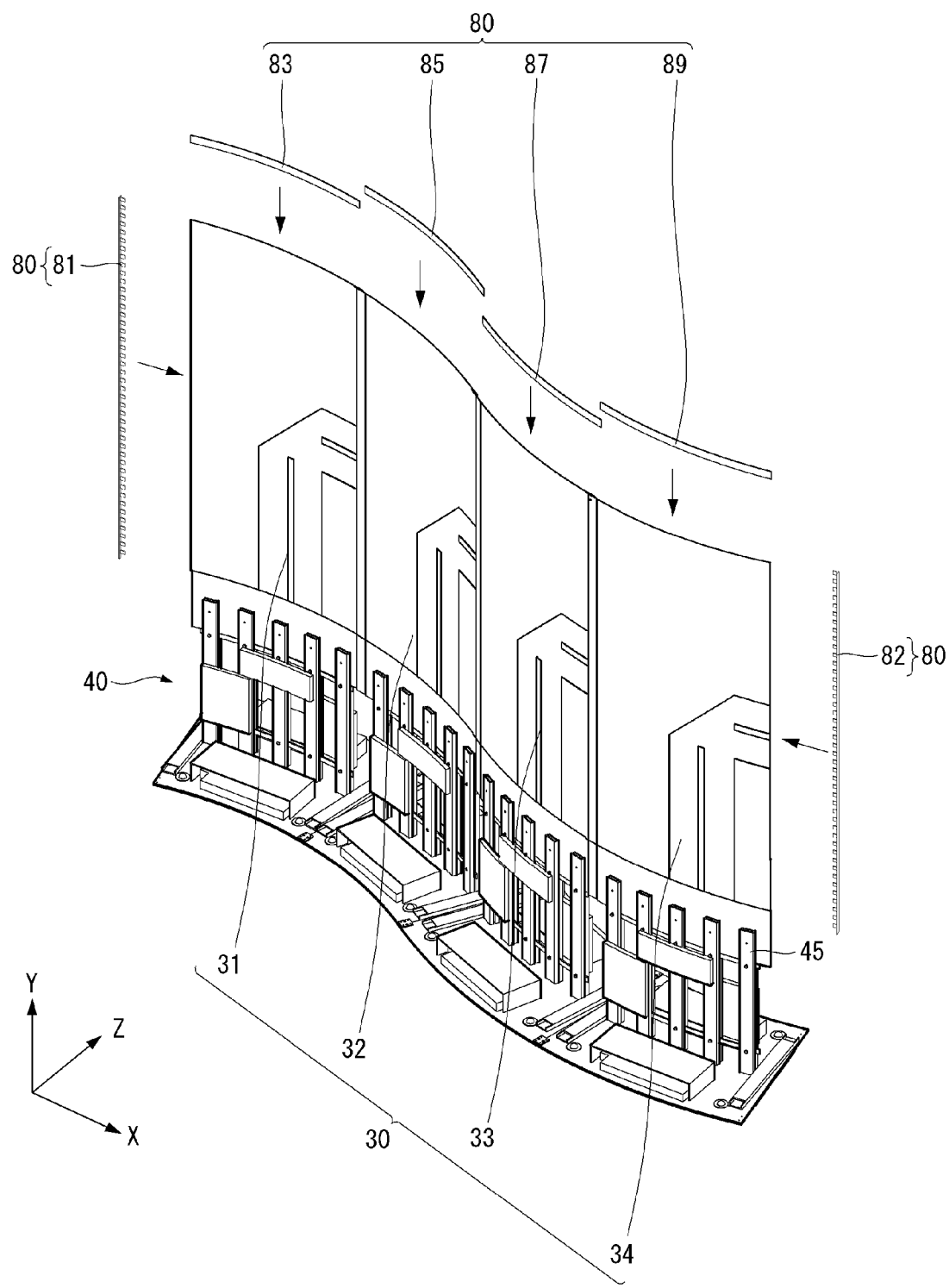

As shown in FIGS. 23 to 25, the display device 1 according to the embodiment of the invention may include a middle frame 80.

As shown in FIG. 23, the middle frame 80 may be coupled to the side and/or the top of the frame 30. The middle frame 80 coupled to the frame 30 may serve to protect the sides of the panel assemblies 10 and 20 that will be coupled to the frame 30. The middle frame 80 may include first and second side middle frames 81 and 82 coupled to the long side of the frame 30 and first to fourth top middle frames 83, 85, 87, and 89 coupled to the short side of the frame 30. For example, the first side middle frame 81 may be coupled to a long side of the first frame 31, and the second side middle frame 82 may be coupled to a long side of the fourth frame 34. The first to fourth top middle frames 83, 85, 87, and 89 may be coupled to short sides of the first to fourth frames 31, 32, 33, and 34.

Figure 24A:
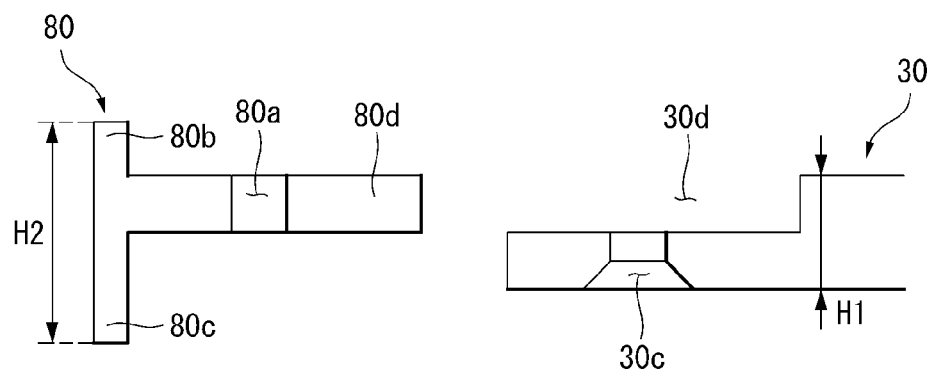

As shown in FIG. 24A, the middle frame 80 may include a body 80d having a first coupling hole 80a and first and second extension portions 80b and 80c that are extended from the body 80d by a second distance H2 in different directions. The second distance H2 may be greater than a first distance H1 corresponding to a thickness of the frame 30.

The frame 30 may include a coupling groove 30d. For example, a portion of the side of the frame 30 may include a stepped portion. For example, a recess having a length corresponding to the body 80d of the middle frame 80 may be formed at the side of the frame 30.

Figure 24B:
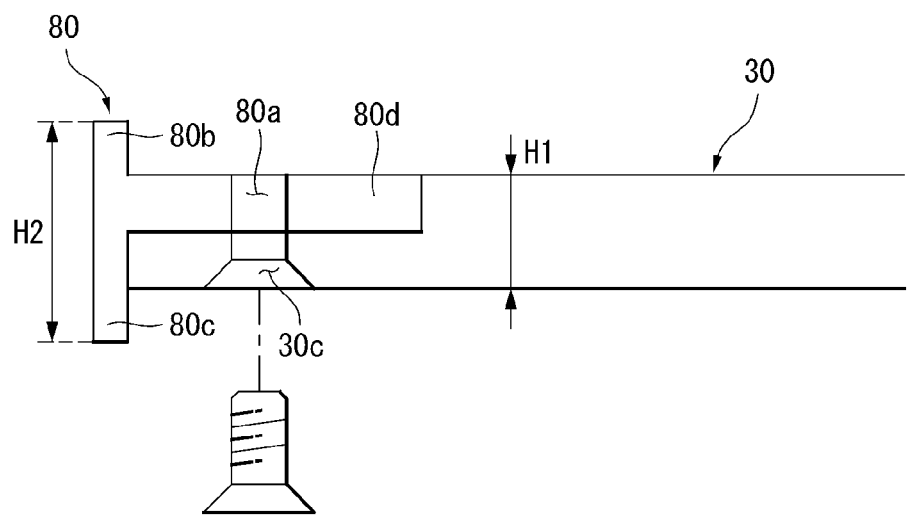

As shown in FIG. 24B, the middle frame 80 may be coupled to the frame 30. A first coupling hole 80a of the middle frame 80 may correspond to a second coupling hole 30c of the frame 30. A fastening member such as a bolt may be coupled to the first and second coupling holes 80a and 30c and may couple the middle frame 80 to the frame 30.

Figure 24C:
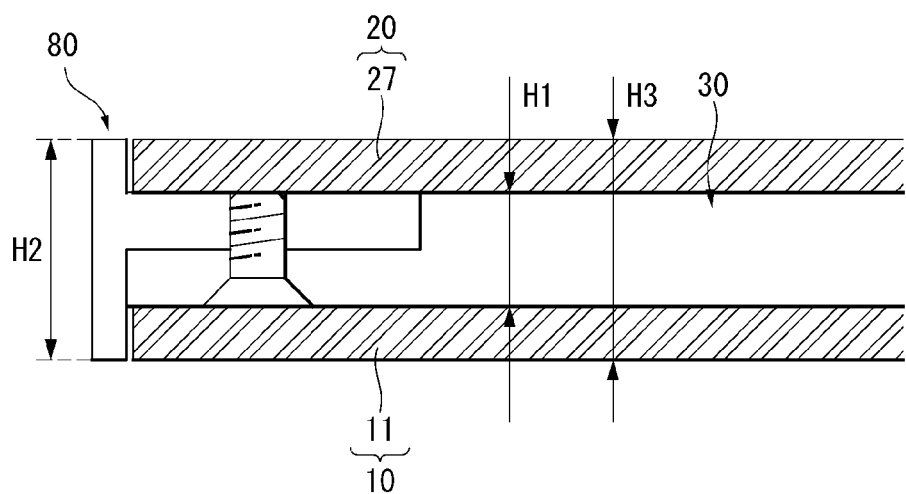

As shown in FIG. 24C, the second distance H2 of the first and second extension portions 80b and 80c may be equal to or greater than a third distance H3 including the panel assemblies 10 and 20 coupled to the frame 30. The panel assemblies 10 and 20 can be protected by the first and second extension portions 80b and 80c extended by the second distance H2. For example, an impact applied to edges of the panel assemblies 10 and 20 can be absorbed in the first and second extension portions 80b and 80c.

Figure 25A:
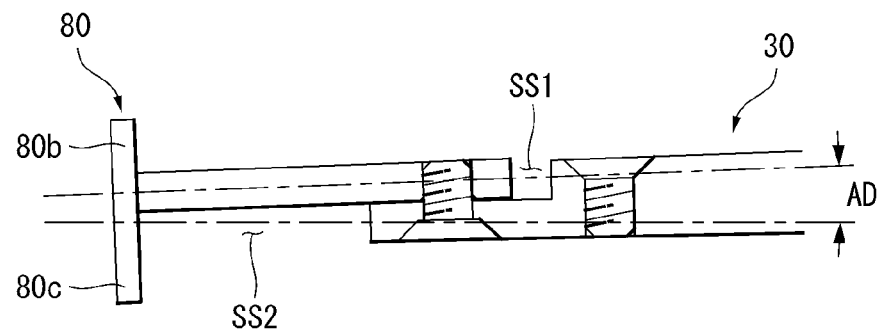

As shown in FIG. 25A, the middle frame 80 may be coupled to the frame 30 in a state where first and second separation spaces SS1 and SS2 are formed. In other words, the middle frame 80 may be in a form that is not completely in contact with the frame 30. The middle frame 80 may be naturally inclined to the frame 30 by the first and second separation spaces SS1 and SS2. For example, an inclination angle AD between the frame 30 and the middle frame 80 may be formed.

Figure 25B:
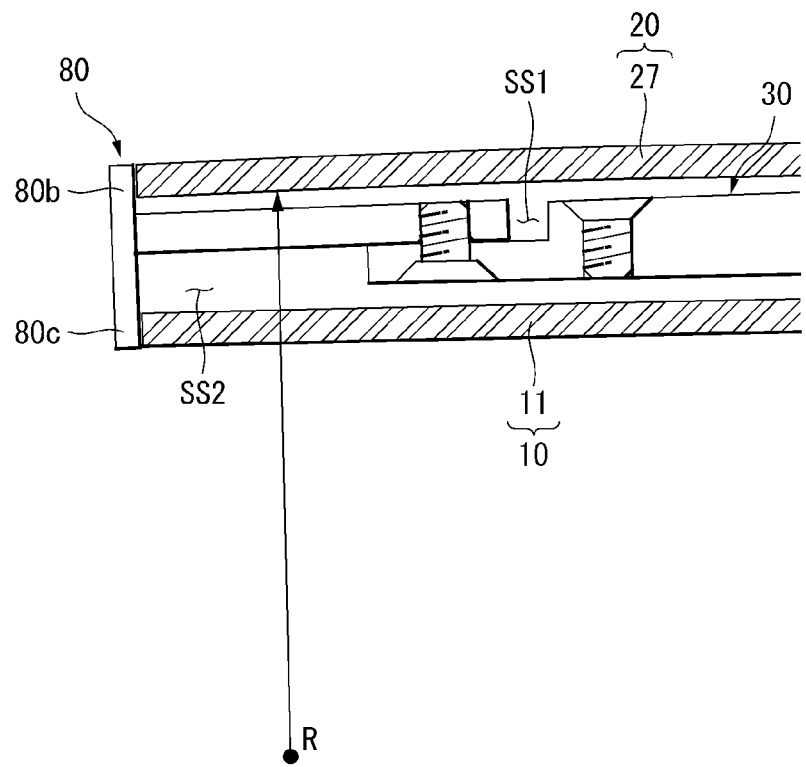

As shown in FIG. 25B, even when the panel assemblies 10 and 20 are coupled to the frame 30, the first and second separation spaces SS1 and SS2 may be maintained. The panel assemblies 10 and 20 may maintain their inherent curvature R due to the first and second separation spaces 30d and 80d and may be coupled to the frame 30. The first and second separation spaces 30d and 80d can prevent a load that may be generated when the panel assemblies 10 and 20 are coupled to the frame 30 in a state where the inherent curvature R is not maintained.

FIGS. 26 to 42 illustrate configuration of a panel assembly according to the embodiment of the invention.

As shown in FIGS. 26 to 42, the panel assemblies 10 and 20 according to the embodiment of the invention may be coupled to the frame 30. The panel assemblies 10 and 20 coupled to the frame 30 may be configured so that a bezel area is minimized. The panel assemblies 10 and 20 coupled to the frame 30 may be configured so that the separation resulting from a concave shape or a convex shape is prevented.

Figure 26:
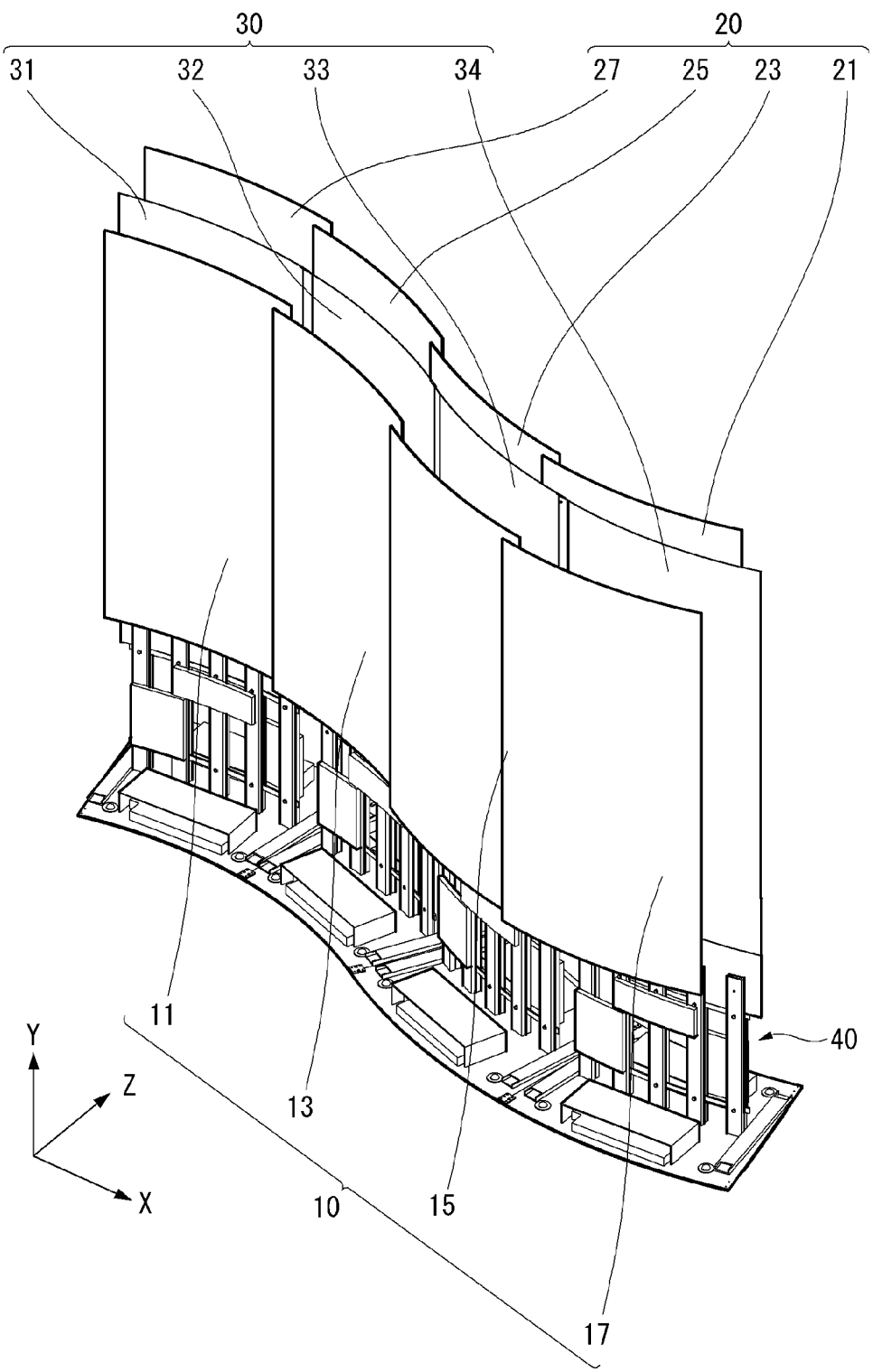
FIGS. 26, 27, 28, 29, 30, 31, 32, 33, 34A, 34B, 35, 36, 37A, 37B, 38, 39, 40A, 40B, 41A, 41B, 41C, 42A and 42B illustrate configuration of a panel assembly according to an embodiment of the invention.

As shown in FIG. 26, the first to fourth front panels 11, 13, 15, and 17 and the first to fourth rear panels 21, 23, 25, and 27 may be coupled to the front surface and the back surface of the frame 30.

The first and second front panels 11 and 13 and the first and second rear panels 21 and 23 may have a concave shape, and the third and fourth front panels 15 and 17 and the third and fourth rear panels 25 and 27 may have a convex shape.

The first to fourth front panels 11, 13, 15, and 17 may be coupled to the frame 30 in the order named. Namely, after the first front panel 11 is coupled to the frame 30, the second front panel 13 may be coupled to the frame 30. Further, the first to fourth rear panels 21, 23, 25, and 27 may be coupled to the frame 30 in the order named in the same manner as the first to fourth front panels 11, 13, 15, and 17.

Figure 27:
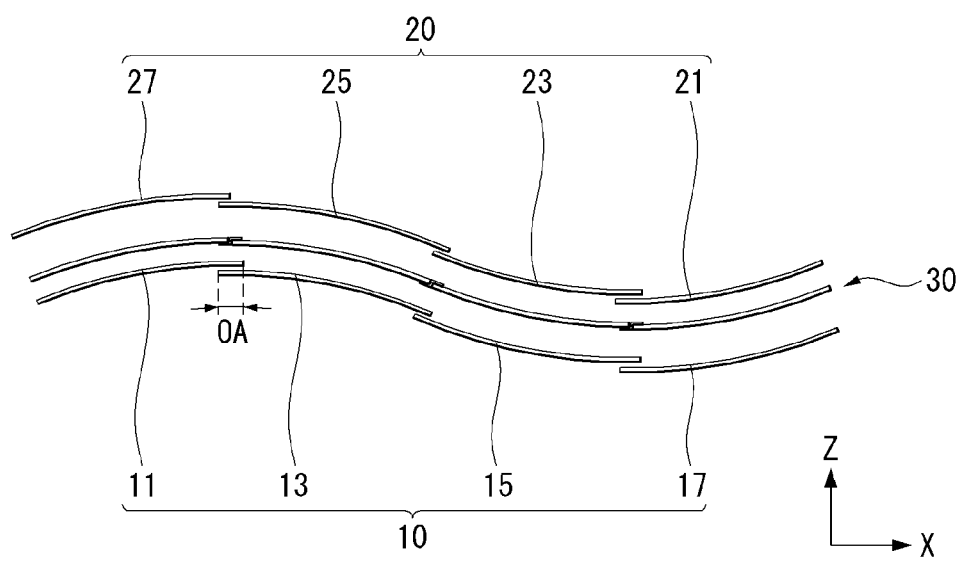

As shown in FIG. 27, each of the front panel 10 and the rear panel 20 may be configured such that one panel overlaps another panel to form an overlap area OA. For example, an overlap area OA may be formed between the first front panel 11 and the second front panel 13. As described above, the front panel 10 and the rear panel 20 may be coupled to the frame 30 in a predetermined order. Thus, the front panel 10 may be configured such that the first front panel 11 is positioned under the second front panel 13, the second front panel 13 is positioned under the third front panel 15, and the third front panel 15 is positioned under the fourth front panel 17. In other words, at least a portion of an Nth front or rear panel may be positioned on a front surface of at least a portion of an (N−1)th front or rear panel, where N is a positive integer equal to or greater than 2.

Figure 28:
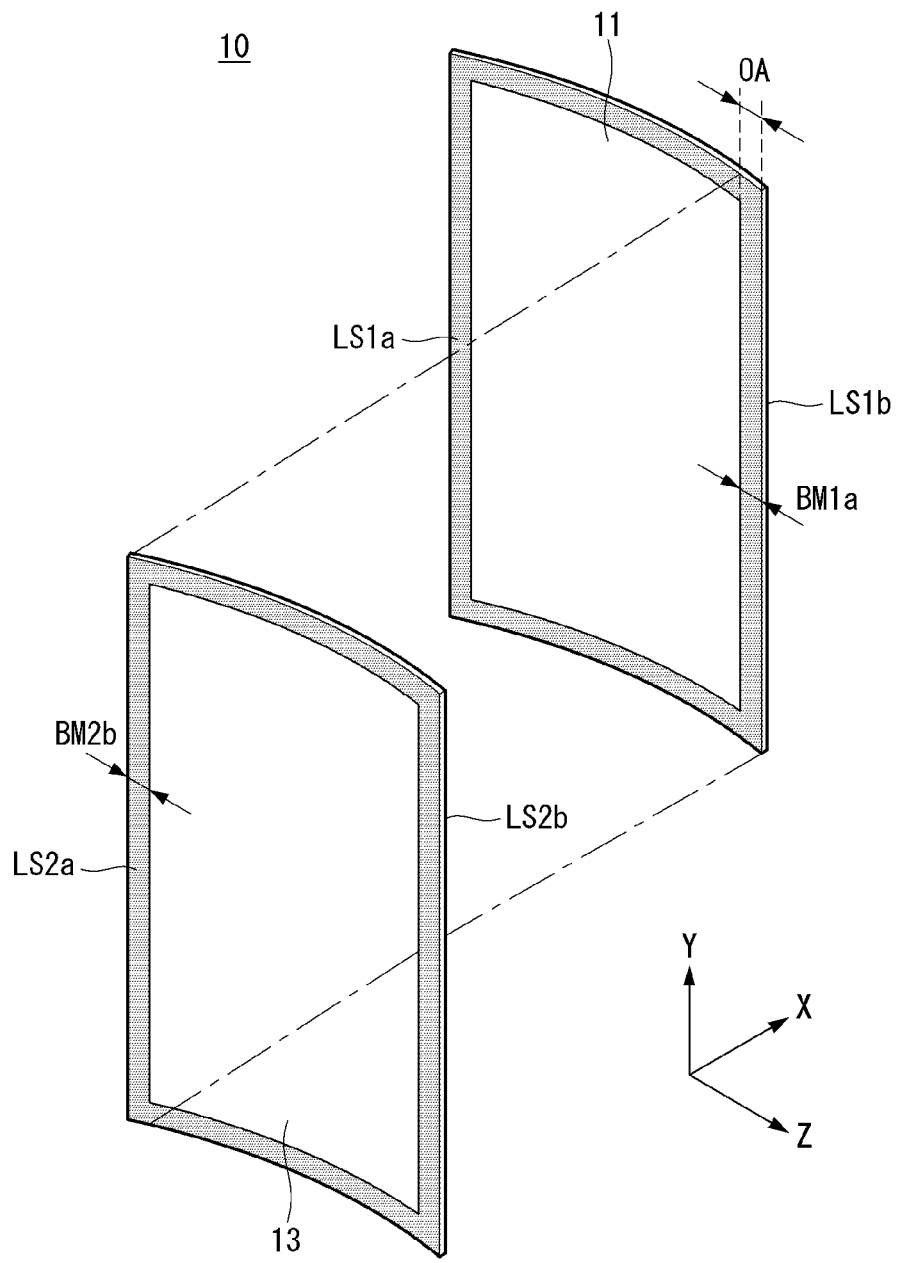
Figure 29:
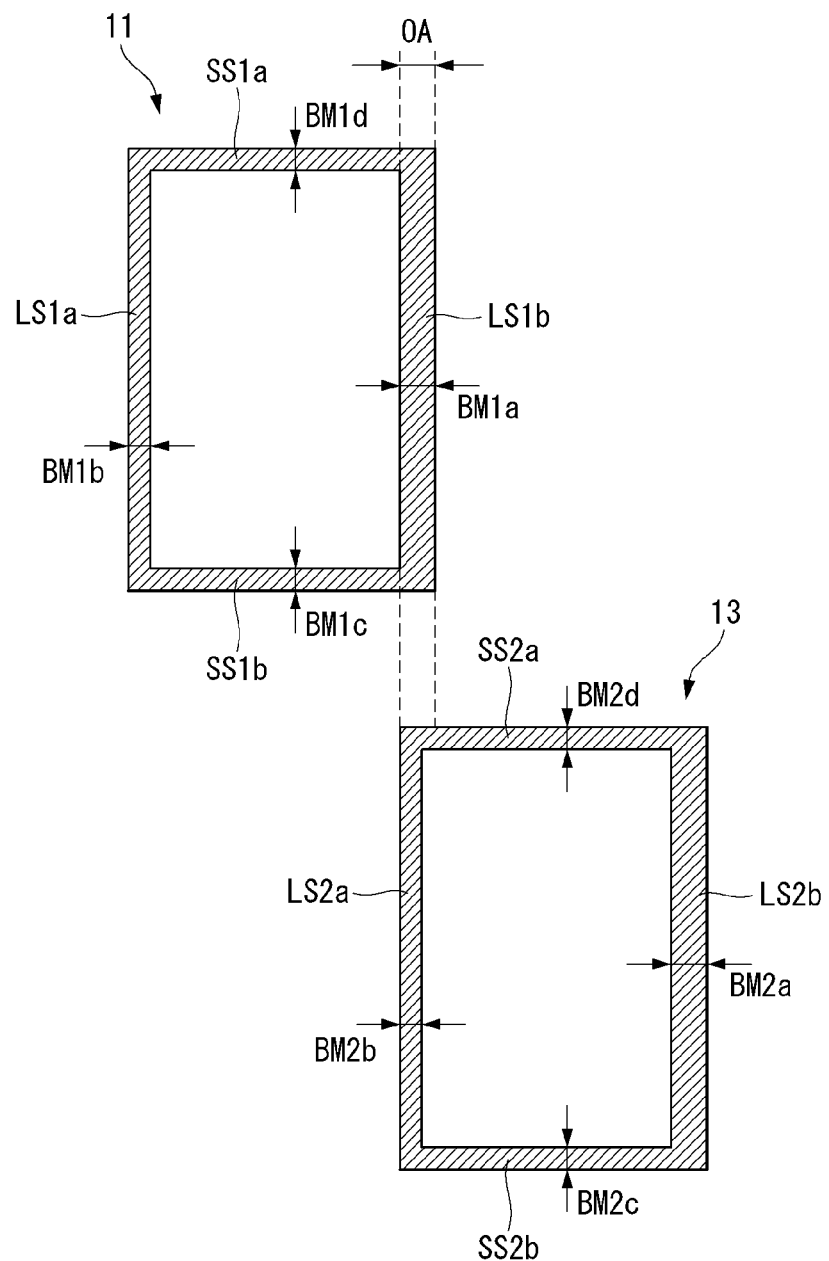

As shown in FIGS. 28 and 29, the first front panel 11 and the second front panel 13 may form an overlap area OA. The first front panel 11 and the second front panel 13 may have a black matrix area.

The black matrix area may be a non-display area at the outside of a display panel. The display panel may include a display area and a non-display area. The display area may be an area displaying an image, and the non-display area may be an area in which an image is not displayed. The display area may be an active area, and the non-display area may be an inactive area. The non-display area may be an area necessary for connection of display electrodes and/or touch electrodes. The non-display area may be formed along long sides and/or short sides of the display panel. Sizes of the non-display area along a specific long side and/or a specific short side may be different from each other. For example, a size of the non-display area corresponding to a specific side, on which a source PCB for driving the display panel is disposed, may be greater than a size of the non-display area corresponding to another side.

As shown in FIG. 28, at least a portion of a second long side LS1b of the first front panel 11 may overlap at least a portion of a first long side LS2a of the second front panel 13. The second long side LS1b of the first front panel 11 may have a 1a non-display area BM1a, and the first long side LS2a of the second front panel 13 may have a 2b non-display area BM2b.

As shown in FIG. 29, in the first front panel 11, a size of the 1a non-display area BM1a may be greater than sizes of 2a to 4a non-display areas BM1b, BM1c, and BM1d. The 1a non-display area BM1a of the first front panel 11 may overlap the 2b non-display area BM2b of the second front panel 13. Thus, a size of the non-display area displayed outside when the 1a non-display area BM1a overlaps the 2b non-display area BM2b may be smaller than a size of the non-display area displayed outside when the 1a non-display area BM1a and the 2b non-display area BM2b are disposed in parallel with each other.

The 2b non-display area BM2b may overlap an inner boundary of the 1a non-display area BM1a. Namely, the first and second front panels 11 and 13 may overlap each other such that the 2b non-display area BM2b is the same as or adjacent to a boundary between the 1a non-display area BM1a and the display area of the first front panel 11.

Figure 30:
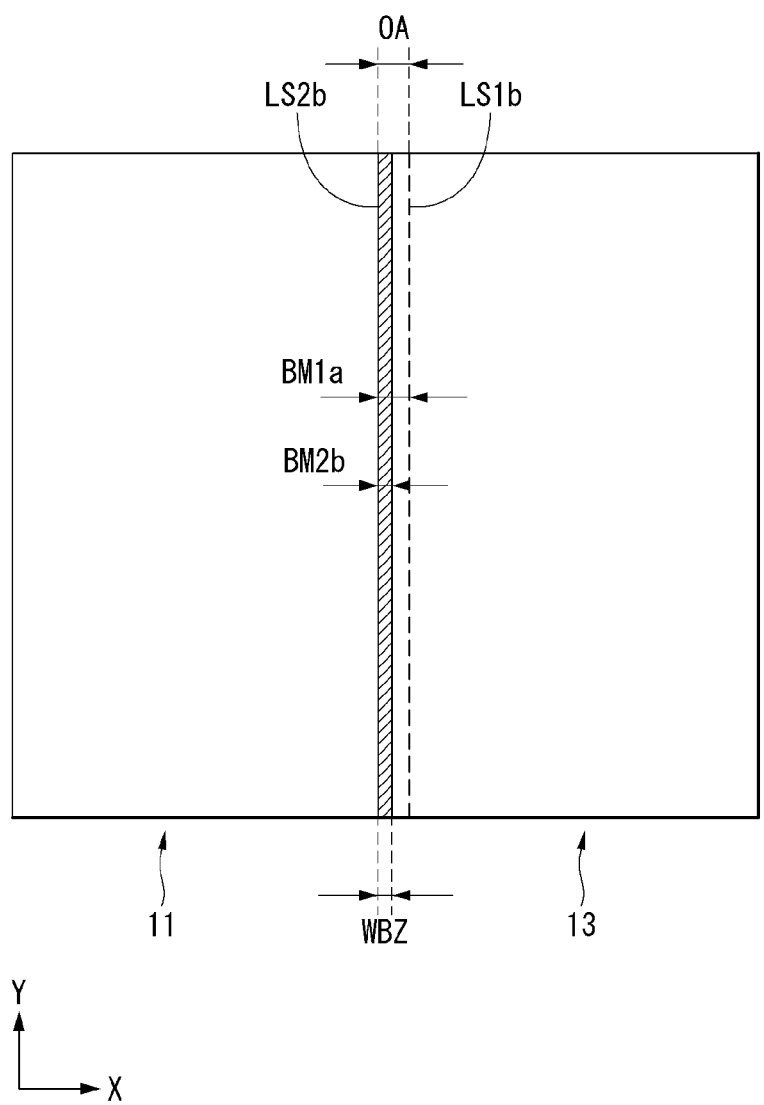

As shown in FIG. 30, when the first and second front panels 11 and 13 are overlapped and coupled with each other, only the non-display area of the second front panel 13 may be observed from the outside. For example, the 1a non-display area BM1a of the first front panel 11 may be covered by the second front panel 13, and the 2b non-display area BM2b of the second front panel 13 may be exposed to the outside. In other words, a non-display area WBZ observed from the outside may be smaller than an overlap area OA when the panels actually overlap each other.

Figure 31:
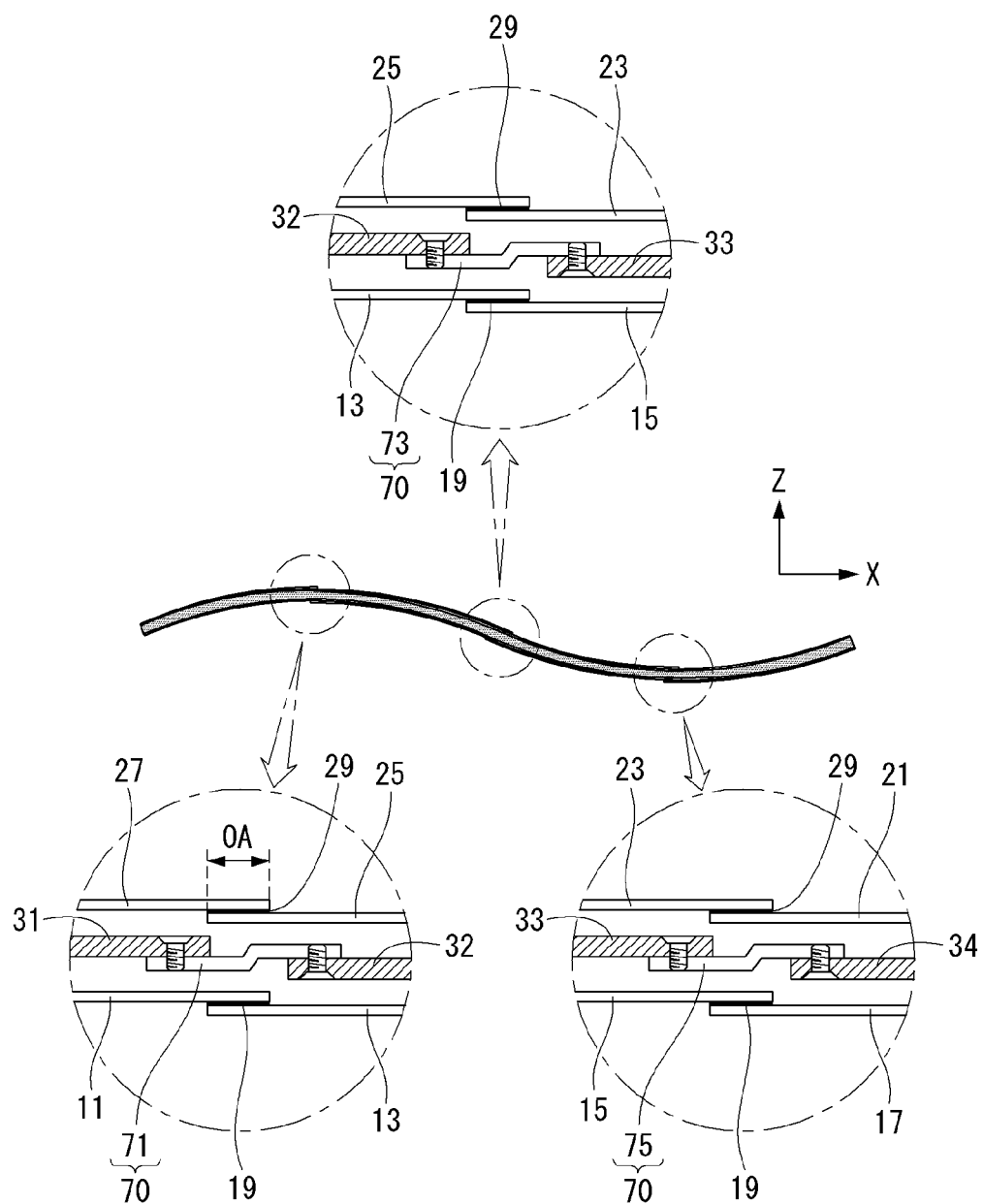

As shown in FIG. 31, the panel assemblies 10 and 20 may be positioned on the front surface and the back surface of the frame 30. The adjacent panel assemblies 10 and 20 may partially overlap each other.

The panel assemblies 10 and 20 may be coupled to each other by adhesive layers 19 and 29. The adhesive layers 19 and 29 may be an adhesive or an adhesive tape corresponding to the overlap area OA. However, the above-described coupling form of the panel assemblies 10 and 20 may be implemented even using the center frame bracket 70 (see FIG. 22) having a depression.

Figure 32:
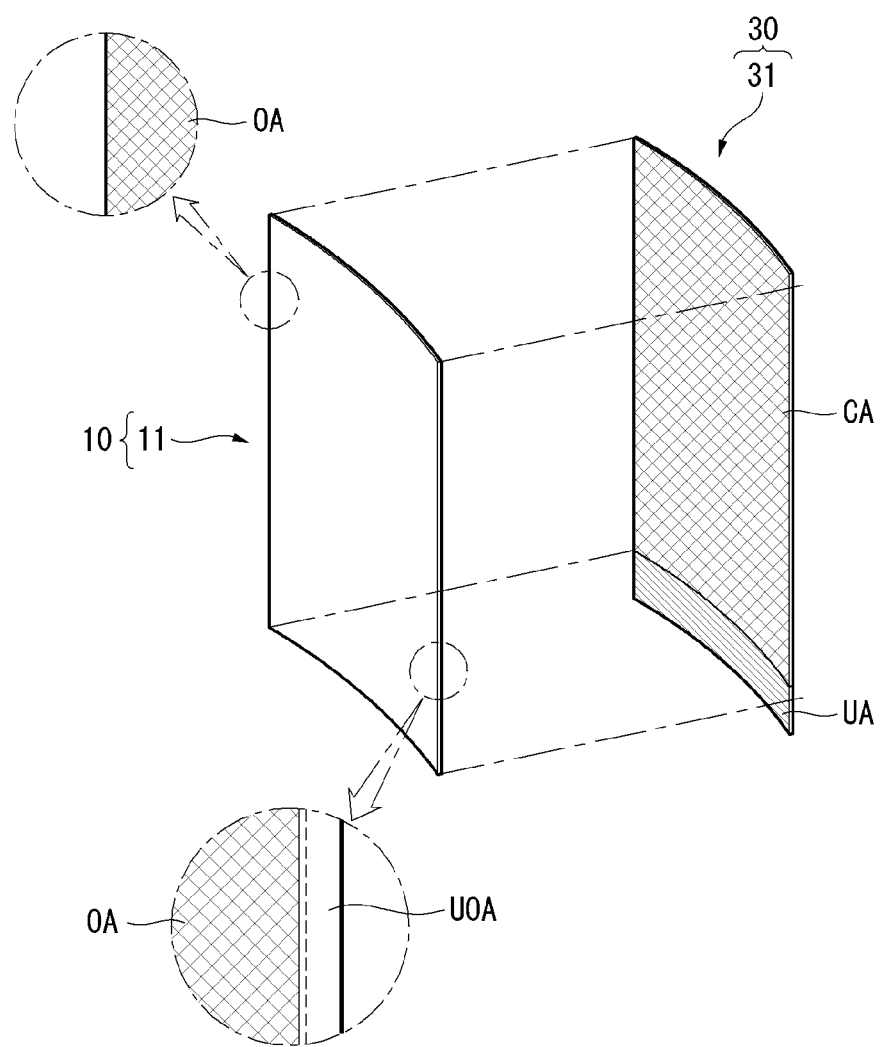

As shown in FIG. 32, at least a portion of the frame 30 may overlap the panel assembly 10. In other words, the sizes of the frame 30 and the panel assembly 10 may not be the same. For example, at least one of a width and/or a length of the frame 30 may be different form at least one of a width and/or a length of the panel assembly 10.

The panel assembly 10 may include a plurality of long sides. A first long side of the plurality of long sides may be at a location corresponding to a first long side of the frame 30. Namely, the first long side of the panel assembly 10 and the first long side of the frame 30 may form an overlap area OA.

A second long side opposite the first long side of the panel assembly 10 may not correspond to a second long side of the frame 30. Namely, the second long side of the panel assembly 10 may more protrude than the second long side of the frame 30. In other words, a non-overlap area UOA may be formed on the second long side of the panel assembly 10.

The non-overlap area UOA may overlap not the first frame 31 but the frame 30. For example, the non-overlap area UOA may overlap the second frame 32 next to the first frame 31. However, it is expressed as the non-overlap area UOA in that the non-overlap area UOA does not overlap the first front panel 11.

The formation of the non-overlap area UOA may indicate that the width of the panel assembly 10 is greater than the width of the frame 30. Thus, the panel assembly 10 may more protrude than the frame 30 by a width difference (or by the non-overlap area UOA).

The frame 30 may have a size different from the panel assembly 10. Namely, as described above, the width of the frame 30 may be different from the width of the panel assembly 10. Further, the length of the frame 30 may be different from the length of the panel assembly 10. For example, the length of the frame 30 may be greater than the length of the panel assembly 10. Thus, a first short side of the panel assembly 10 may be at a location corresponding to a first short side of the frame 30, but a second short side opposite the first short side of the panel assembly 10 may not correspond to a second short side of the frame 30. Hence, the frame 30 may be divided into an overlap area CA and a non-overlap area UA. The non-overlap area UA may be an area where the frame 30 is coupled to the stand assembly 40.

Figure 33:
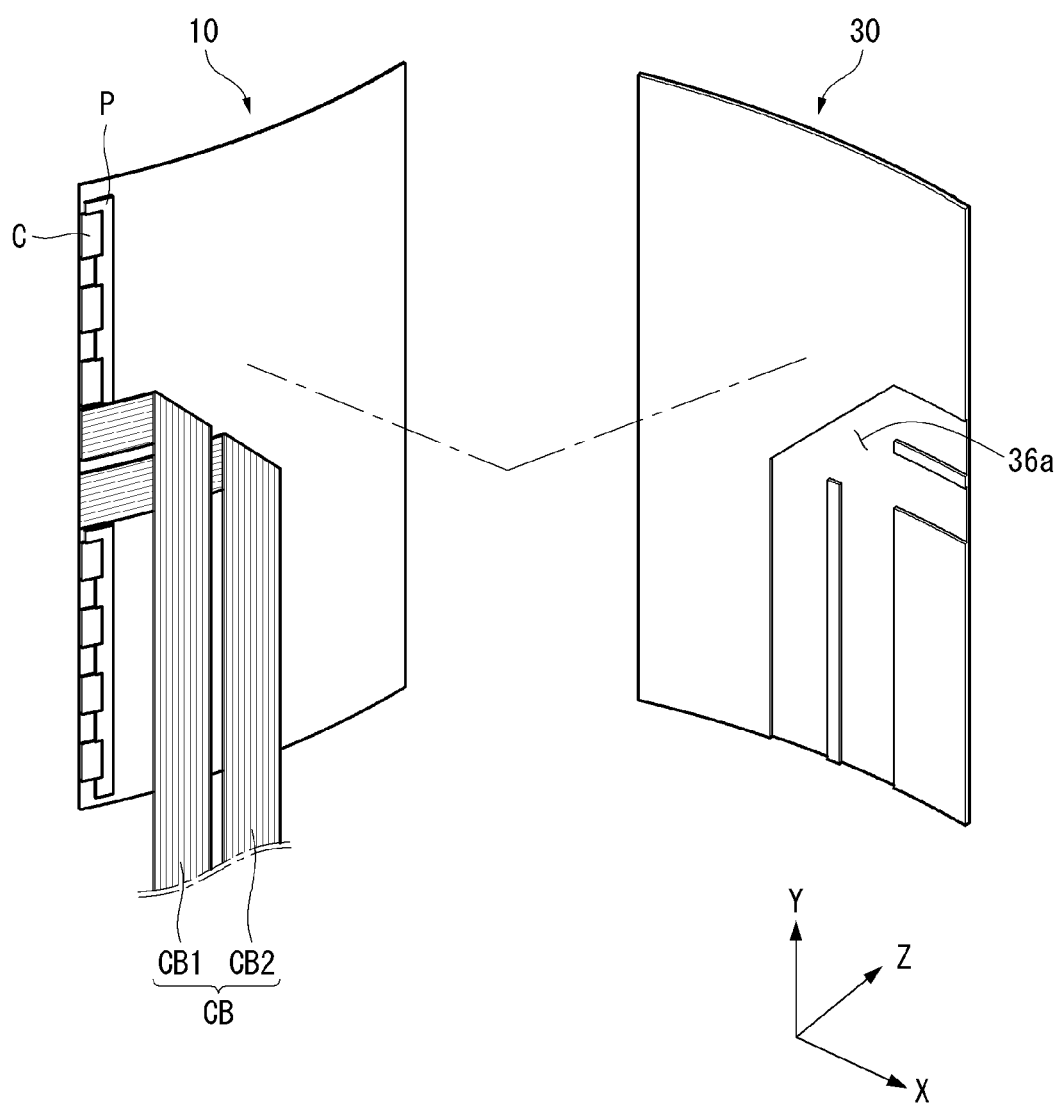

As shown in FIG. 33, a cable CB may be positioned on the back surface of the panel assembly 10. Namely, the cable CB may be used to supply signals and/or electric power required to drive a source PCB P, a chip-on film (COF) C, etc. necessary for an operation of the panel assembly 10. The cable CB may be a plurality of cables including first and second cables CB1 and CB2.

The panel assembly 10 may have long sides disposed in the longitudinal direction. Namely, the panel assembly 10 may be disposed in the longitudinal direction. In other words, the long sides of the panel assembly 10 may be disposed in a direction perpendicular to an installation surface (i.e., the ground). The source PCB P, the COF C, or the like may be disposed on one of the long sides of the panel assembly 10, and the cable CB may be extended from the one long side of the panel assembly 10.

The cable CB may be folded at least once. Namely, because the long side of the panel assembly 10 connected to the cable CB is longitudinally disposed, the cable CB extended in a direction parallel to the installation surface may be folded at least once and extended toward the ground. In other words, the extending direction of the cable CB may be changed to a direction toward the stand assembly 40.

The frame 30 may have a first groove 36a corresponding to the cable CB. Because the relatively protruding cable CB is accommodated in the first groove 36a, the panel assembly 10 and the frame 30 may be in close contact with each other.

Figure 34A:
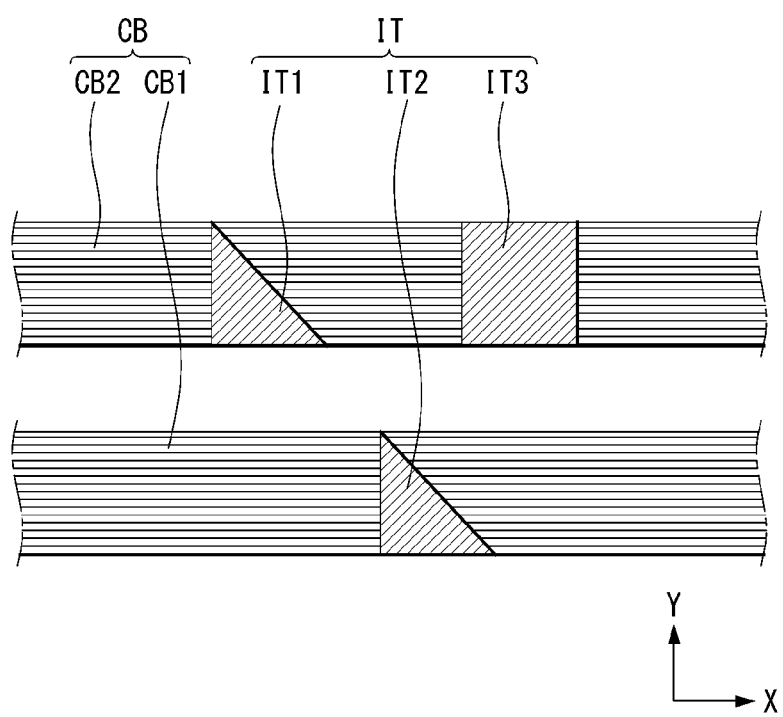

As shown in FIG. 34A, an insulating layer IT may be disposed on the first and second cables CB1 and CB2. The insulating layer IT may correspond to an area where the first and second cables CB1 and CB2 are bent. The insulating layer IT may be formed in a triangular and/or rectangular shape. The insulating layer IT may include first to third insulating layers IT1 to IT3. The first to third insulating layers IT1 to IT3 may be spaced apart from one another.

The insulating layer IT may include an adhesive layer. For example, an adhesive tape or an adhesive may be applied to one surface and/or the other surface of the insulating layer IT. The bending areas of the first and second cables CB1 and CB2 may be attached to each other by the adhesive layer.

Figure 34B:
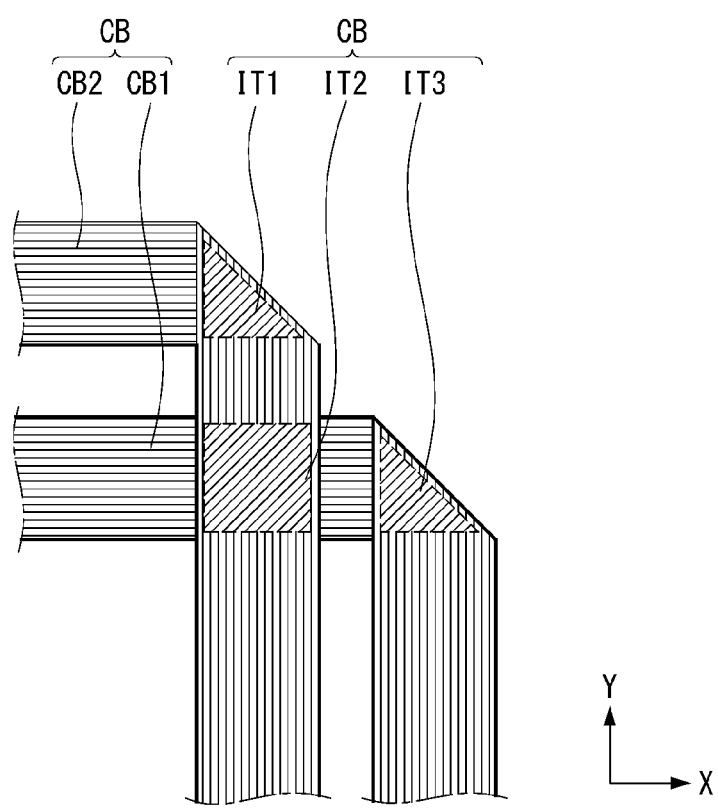

As shown in FIG. 34B, each of the first and second cables CB1 and CB2 may be bent once. The bent first and second cables CB1 and CB2 may be adjacent to each other at the first to third insulating layers IT1 to IT3. The first to third insulating layers IT1 to IT3 can prevent the electrical connection of the first and second cables CB1 and CB2 in the bending areas of the first and second cables CB1 and CB2. The first to third insulating layers IT1 to IT3 may be attached to and in close contact with one another in the bending areas.

FIGS. 35 to 42 illustrate configuration related to the coupling of the panel assemblies 10 and 20. As shown in FIGS. 35 to 42, the display device 1 according to the embodiment of the invention may include a configuration capable of solving the problem of coupling resulting from the concave and/or convex panel assemblies 10 and 20.

Figure 35:
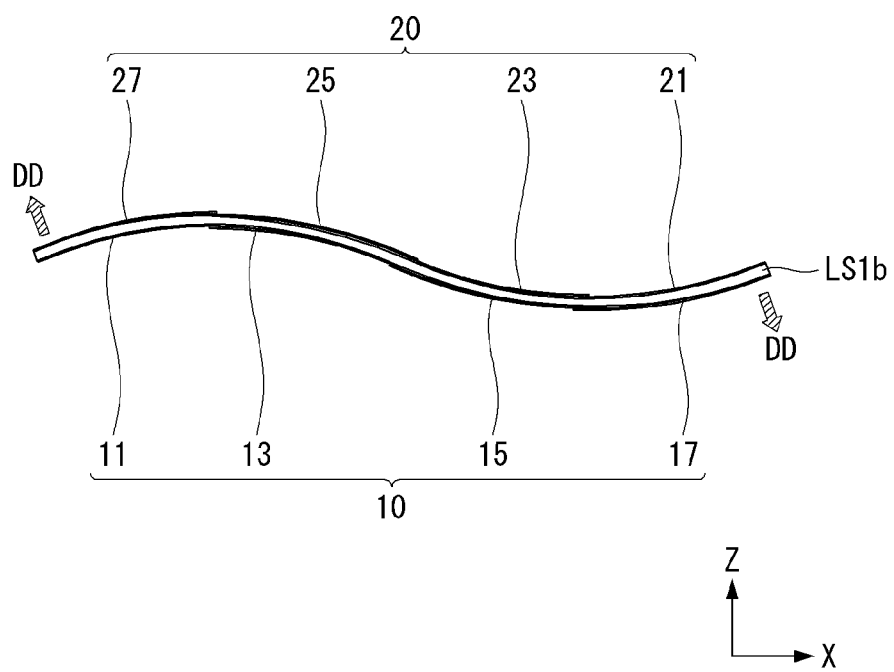

As shown in FIG. 35, the first and second front panels 11 and 13 and the first and second rear panels 21 and 23 may be formed in a concave shape, and the third and fourth front panels 15 and 17 and the third and fourth rear panels 25 and 27 may be formed in a convex shape.

Concave portions of the panel assemblies 10 and 20 may maintain the concave shape by being supported by the frame 30 formed of a metal material including aluminum, etc. For example, even when an elastic force for flattening is generated, the concave portions of the panel assemblies 10 and 20 may be supported by the frame 30 to maintain the concave shape.

Convex portions of the panel assemblies 10 and 20 may be spaced apart from the frame 30 by an elastic force for flattening. In Particular, the last long sides of the fourth front panel 17 and the fourth rear panel 27 may be separated in a separation direction DD. The display device 1 according to the embodiment of the invention may include a configuration for preventing the panel assembly 10 and 20 from being spaced apart from the frame 30.

Figure 36:
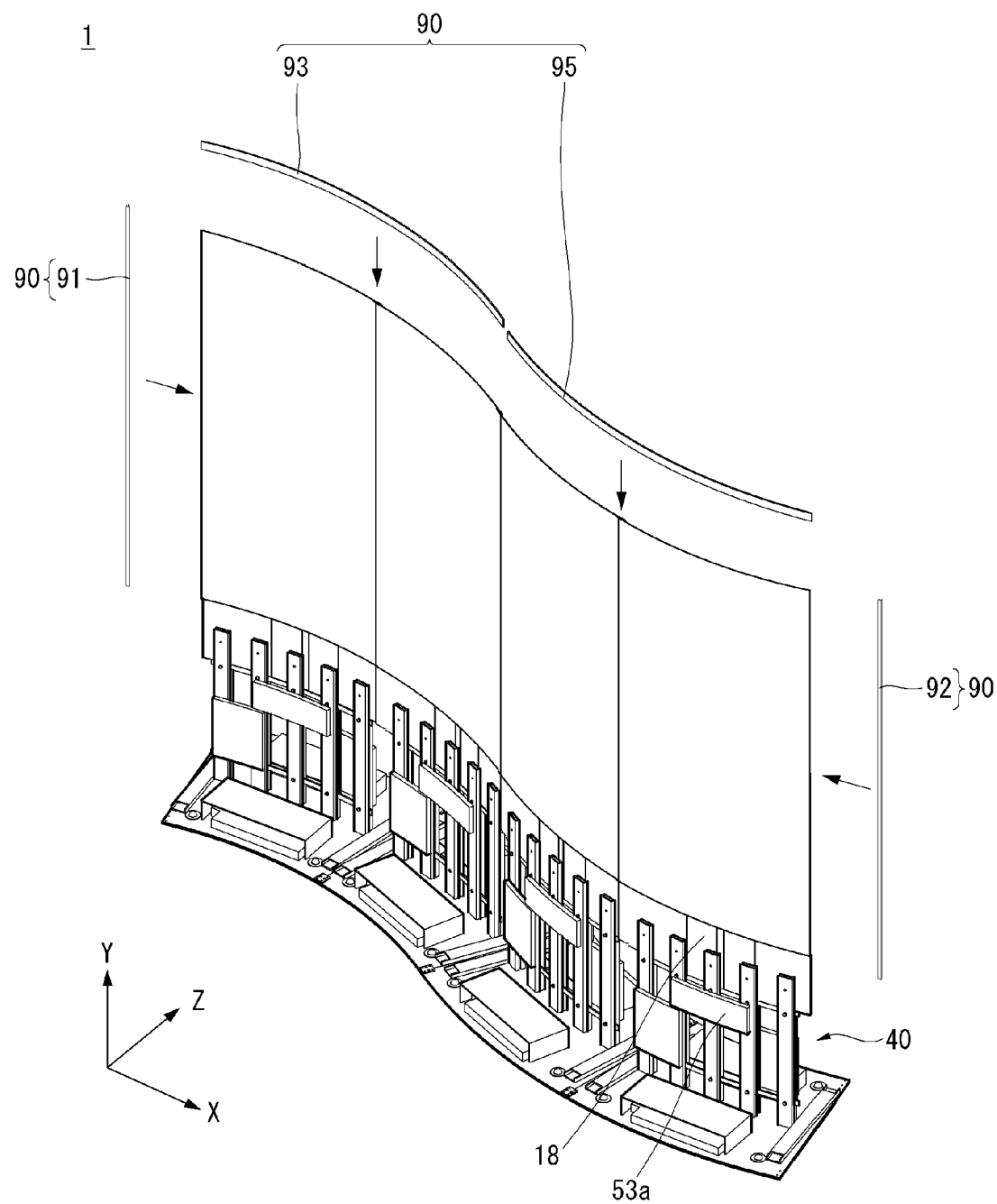

As shown in FIG. 36, a deco 90 may be coupled to the panel assemblies 10 and 20. The deco 90 may be coupled after a process for assembling the panel assemblies 10 and 20. The deco 90 may include first and second side decos 91 and 92 coupled to both long sides of the panel assemblies 10 and 20 and first and second top decos 93 and 95 coupled to both short sides of the panel assemblies 10 and 20. The decor 90 may serve as a bezel.

The deco 90 may provide a beautiful appearance of the display device 1. Namely, the deco 90 may be exposed to the outside from the side of the display device 1.

The deco 90 can prevent the panel assemblies 10 and 20 from being separated from the frame 30. Namely, the deco 90 may have a structure capable of preventing the panel assemblies 10 and 20 from being separated from the frame 30.

Figure 37A:
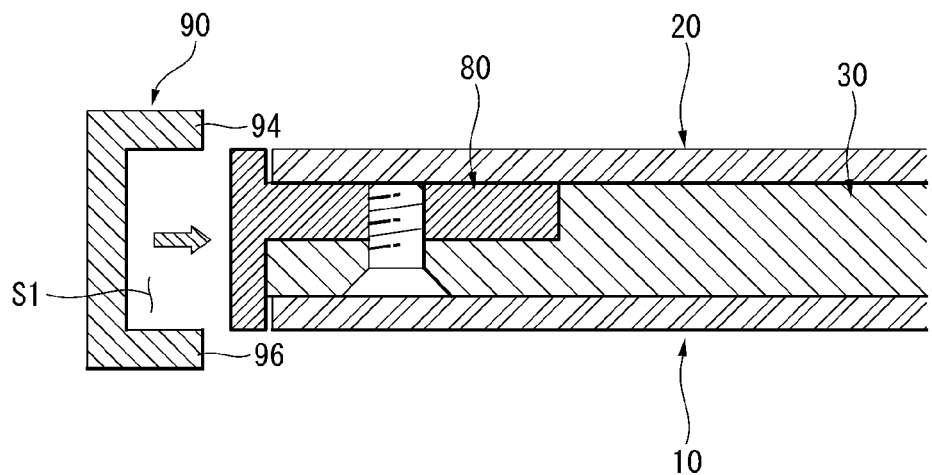

As shown in FIG. 37A, one surface of the deco 90 may be opened. For example, first and second extension portions 94 and 96 may protrude to form a coupling area 51.

Figure 37B:
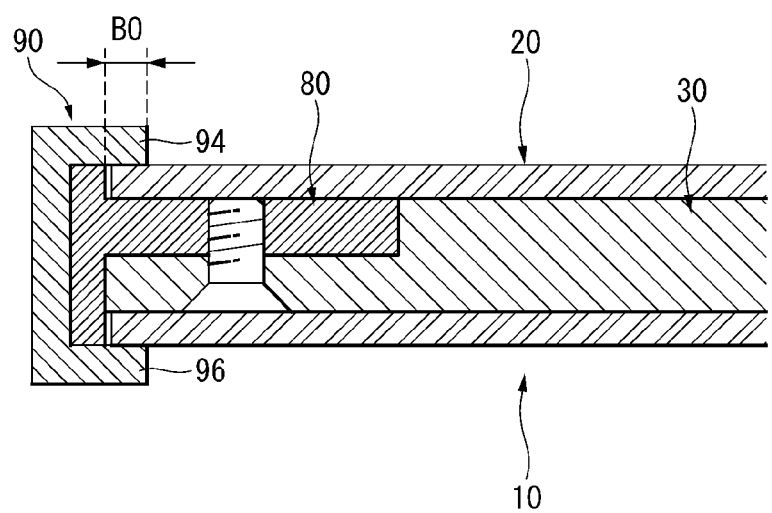

As shown in FIG. 37B, when the first and second extension portions 94 and 96 are coupled, the deco 90 may be in the form of surrounding the side of the display device 1. In other words, at least one of the first and second extension portions 94 and 96 may form an overlap area BO together with at least a portion of the display surface of each of the front and rear panels 10 and 20. The first and second extension portions 94 and 96 protruding toward the display surface may serve as the bezel. The decor 90 can protect the front and rear panels 10 and 20 and can provide the beautiful appearance of the display device 1. The display surface may indicate a surface of the panel on which an image is displayed. Namely, the display surface may be a surface opposite the back surface of the panel.

The deco 90 may prevent the front and rear panels 10 and 20 from being separated from the frame 30 by the first and second extension portions 94 and 96.

Figure 38:
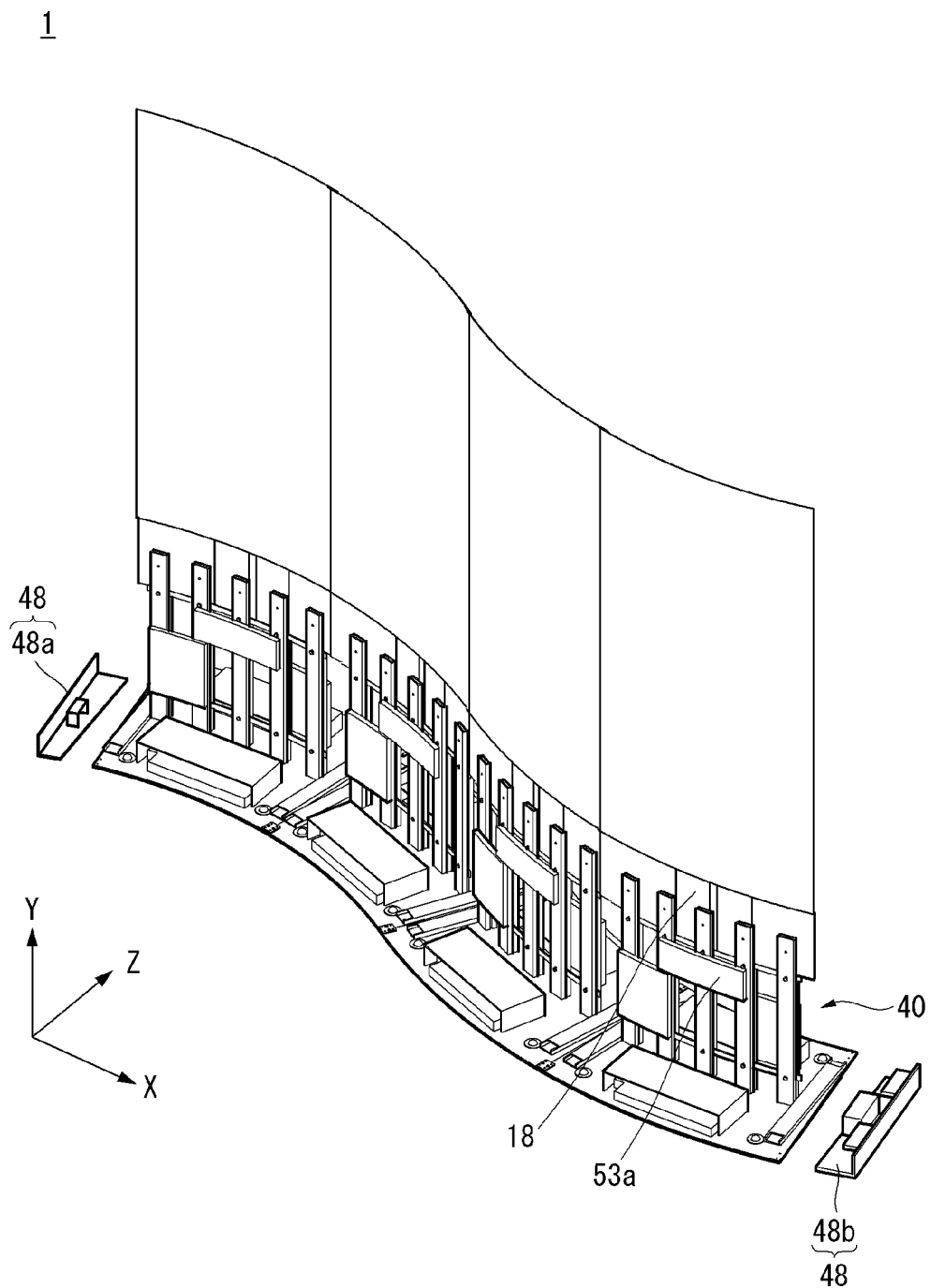
Figure 39:
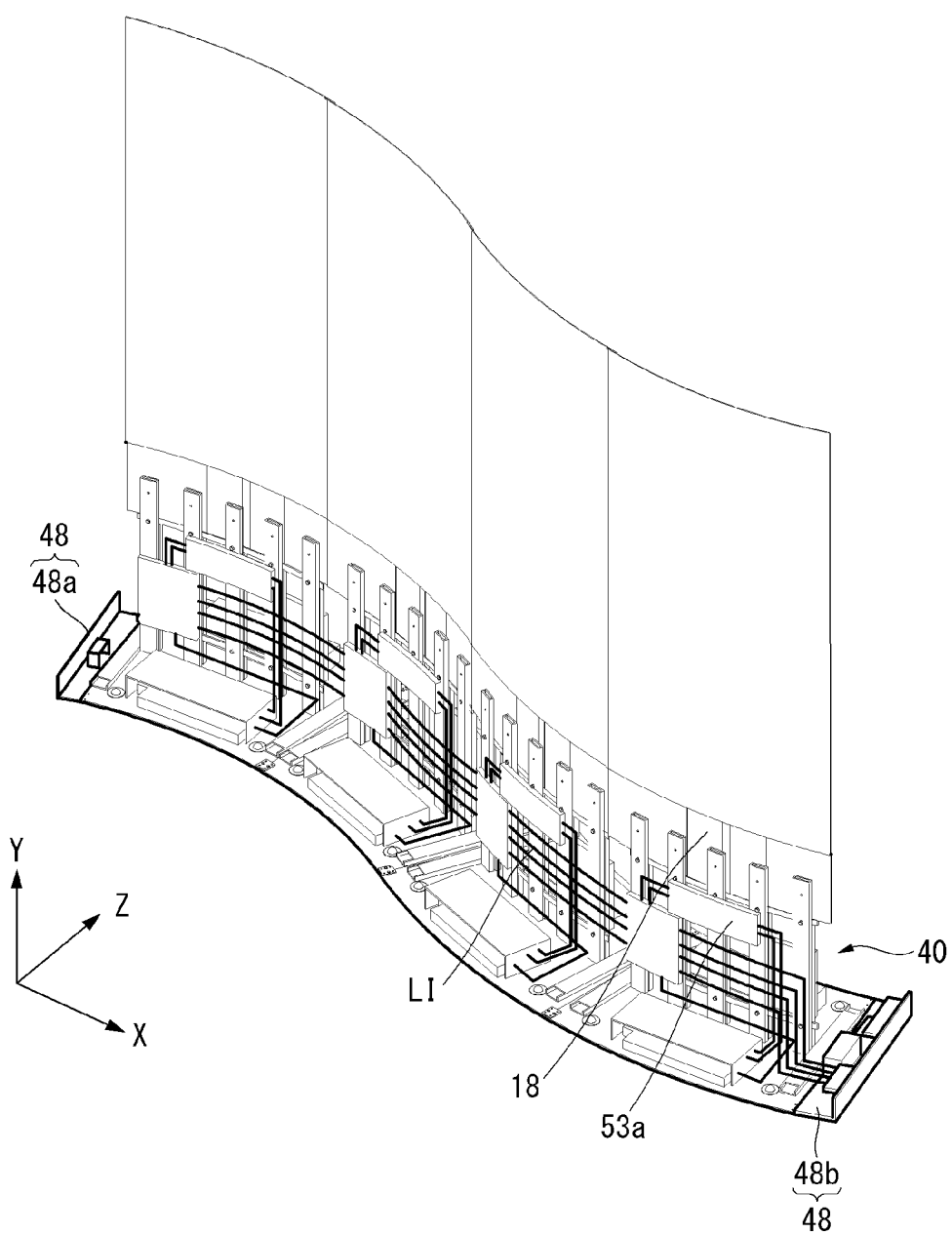

As shown in FIGS. 38 and 39, the display device 1 according to the embodiment of the invention may include a stand side assembly 48. The stand side assembly 48 may serve as an interface for the components coupled to the stand assembly 40.

As shown in FIG. 38, the stand side assembly 48 may be coupled to the stand assembly 40. The stand side assembly 48 may be coupled to the side assembly 40 through a fastening member such as a screw.

The stand side assembly 48 may include a first stand side assembly 48a coupled to one side of the stand assembly 40 and a second stand side assembly 48b coupled to the other side of the stand assembly 40.

As shown in FIG. 39, lines LI supplying signals and/or electric power necessary for the operation of the display device 1 may be connected to the stand side assembly 48. The lines LI may be connected to the component, for example, the T-con unit 53a. The lines LI may be connected to at least one of the first and second stand side assemblies 48a and 48b.

As shown in FIGS. 40 to 42, the display device 1 according to the embodiment of the invention may include a fixture 130 for preventing the separation of the panel assemblies 10 and 20. The fixture 130 may include an adhesive and/or a magnet.

Figure 40A:
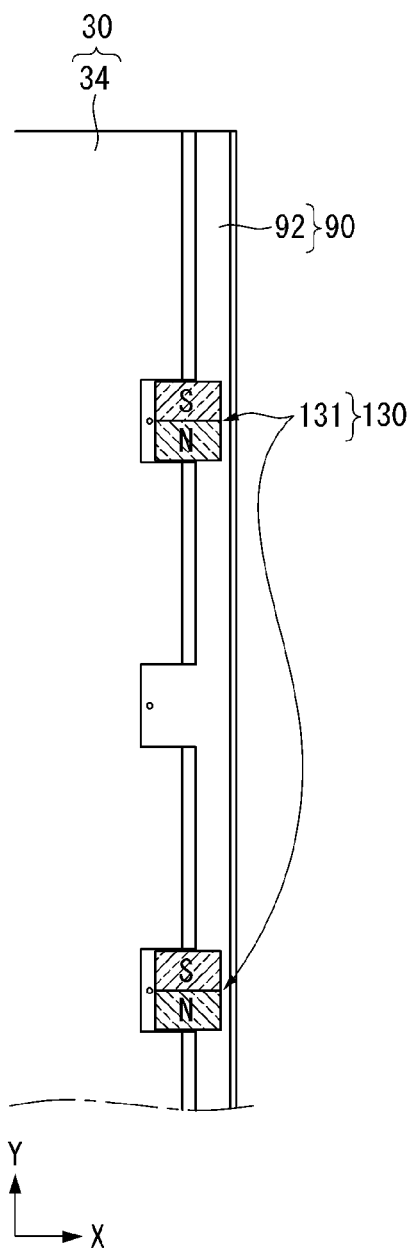

As shown in FIG. 40A, a first fixture 131 may be positioned on the frame 30. For example, the first fixture 131 may be disposed along the inside of the long side of the fourth frame 34. The first fixture 131 may be a magnet. The first fixture 131 may be the second side deco 92.

Figure 40B:
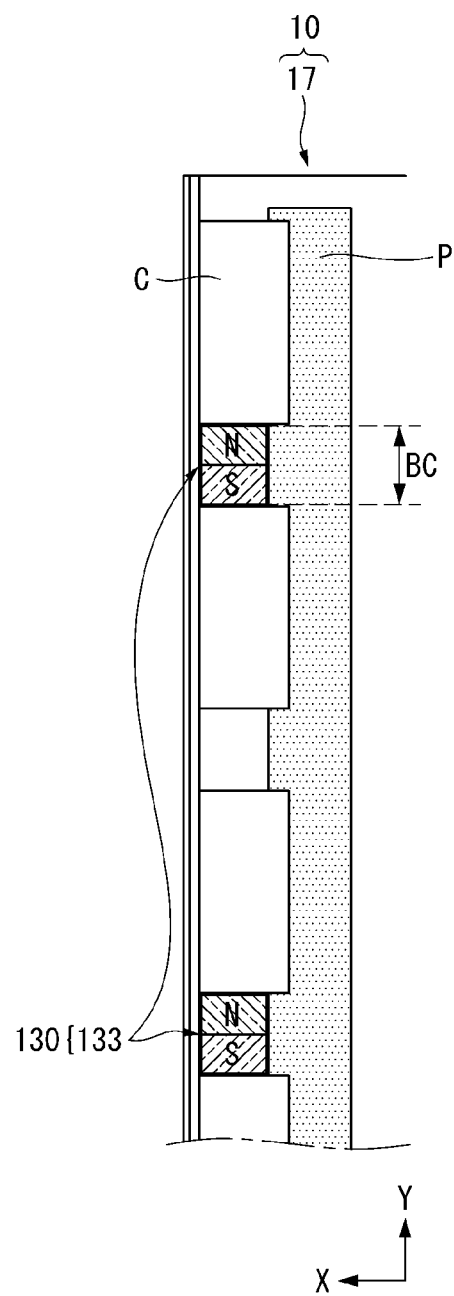

As shown in FIG. 40B, a second fixture 133 may be positioned on the display panels 10 and 20. For example, the second fixture 133 may be disposed along the inside of the long side of the fourth front panel 17. The second fixture 133 may have a location and/or a shape corresponding to the first fixture 131. The second fixture 133 may be a magnet and/or a metal capable of forming an attractive force with respect to the first fixture 131.

The second fixture 133 may be disposed at a location that does not interfere with other components on the inner surface of the fourth front panel 17. For example, the source PCB P, the COF C, or the like may be disposed on the inner surface of the fourth front panel 17. The second fixture 133 may be disposed not to overlap the source PCB P, the COF C, or the like. For example, the second fixture 133 may be disposed in a blank area BC between the COFs C.

Figure 41A:
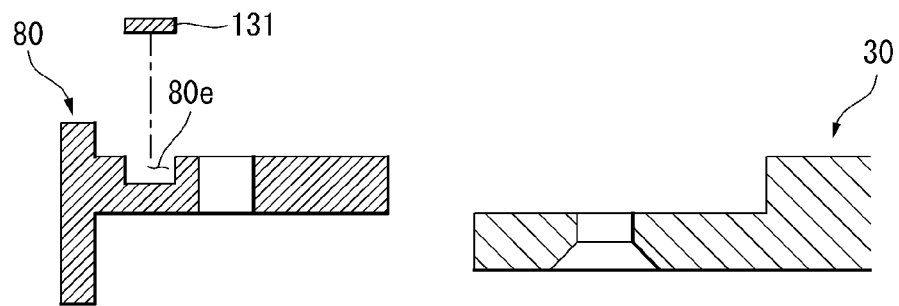

As shown in FIG. 41A, the middle frame 80 may have a coupling groove 80e. The coupling groove 80e may be a recess formed in a portion of the middle frame 80. The first fixture 131 may be inserted into the coupling groove 80e.

Figure 41B:
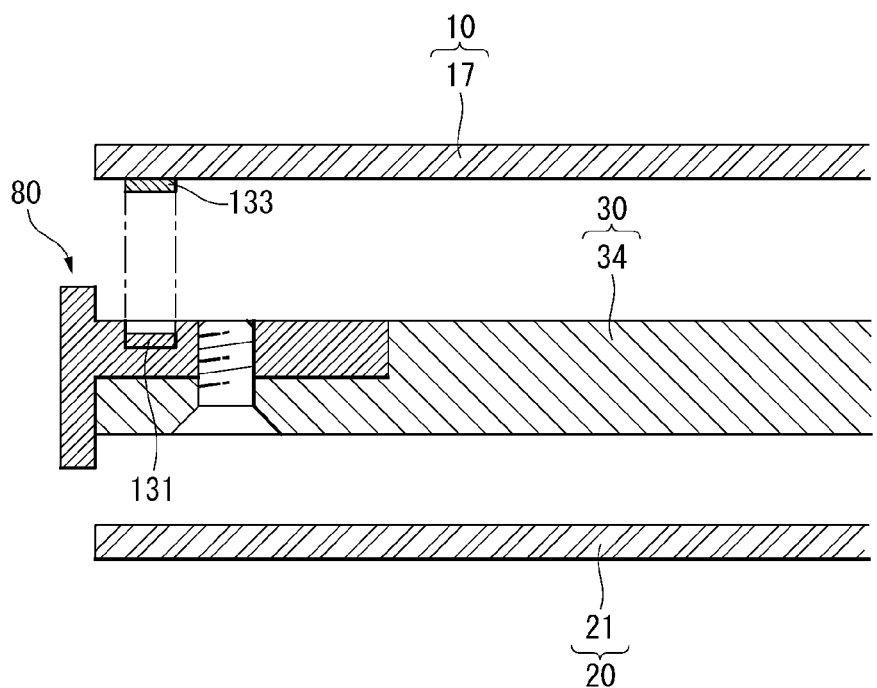

As shown in FIG. 41B, the second fixture 133 may be positioned on the inner surface of the front panel 10. For example, the second fixture 133 may be positioned on the inner surface of the fourth front panel 17. In other words, the second fixture 133 may be positioned on the fourth front panel 17 of the convex shape.

Figure 41C:
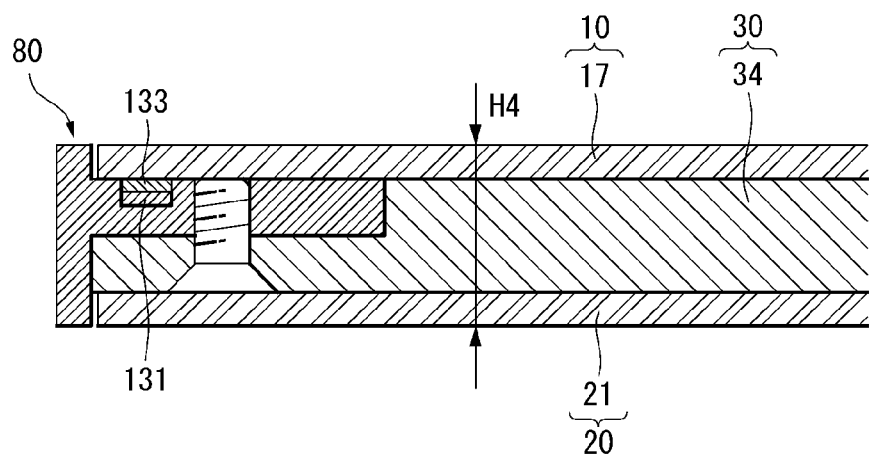

As shown in FIG. 41C, a depth of the coupling groove 80e may correspond to heights of the first and second fixtures 131 and 133. Thus, a sum (i.e., a fourth height H4) of thicknesses of the panel assemblies 10 and 20 and the frame 30 may not increase or may be minimized irrespective of the formation of the first and second fixtures 131 and 133. The fourth front panel 17 of the convex shape may be stably attached to the frame 30 due to magnets, that have an attractive force between them, and/or metal bodies (i.e., the first and second fixtures 131 and 133) corresponding to the magnets. Further, although not shown, the deco 90 (see FIG. 37) may be coupled, in addition to the first and second fixtures 131 and 133.

Figure 42A:
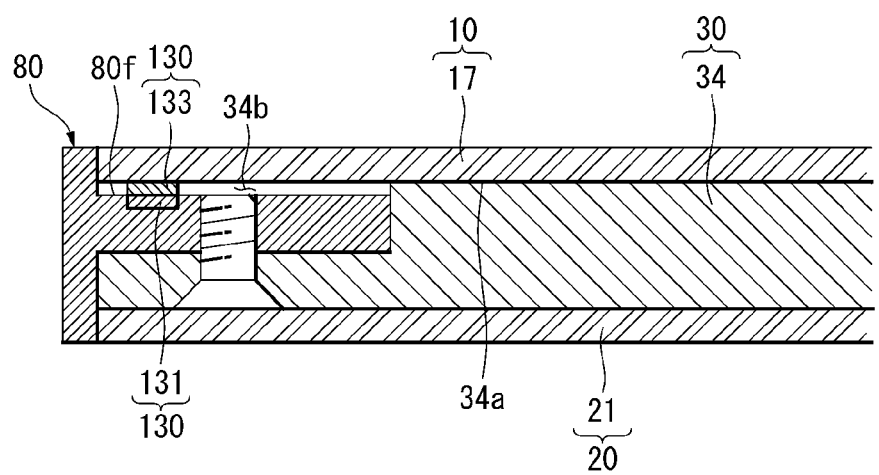

As shown in FIG. 42A, a separation area 34b may be provided between the inner surface of the fourth front panel 17 and a coupling surface 80f of the middle frame 80. The second fixture 133 may be positioned in at least a portion of the separation area 34b. The fourth front panel 17 may naturally bend depending on its inherent curvature due to the separation area 34b.

Figure 42B:
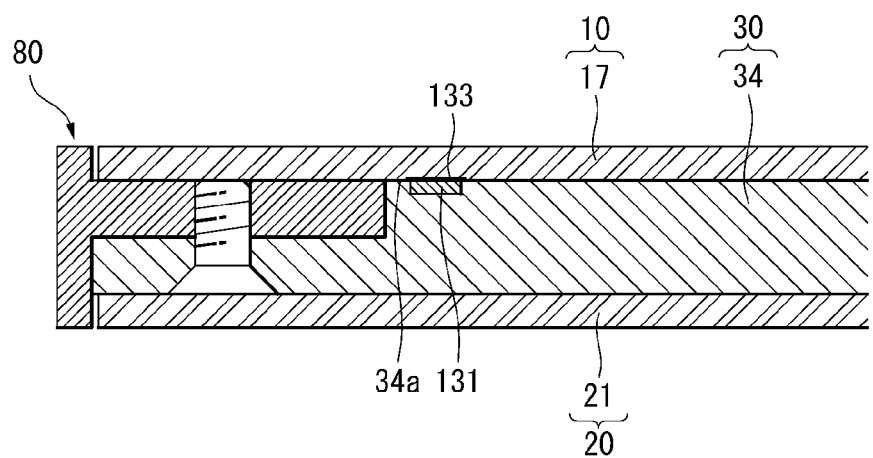

As shown in FIG. 42B, the first fixture 131 may be formed on the frame 30. For example, the first fixture 131 may be disposed on one side of the fourth frame 34. The second fixture 133 may be disposed on the inner surface of the fourth front panel 17 corresponding to the first fixture 131. The second fixture 133 may be a magnet and/or a metal body. Such a structure may be applied to a case in which a sufficient space is not secured in the middle frame 80 and/or the inner area of the front panel 10 corresponding to the middle frame 80.

FIGS. 43 to 48 illustrate configuration of a cover assembly according to the embodiment of the invention.

Figure 43:
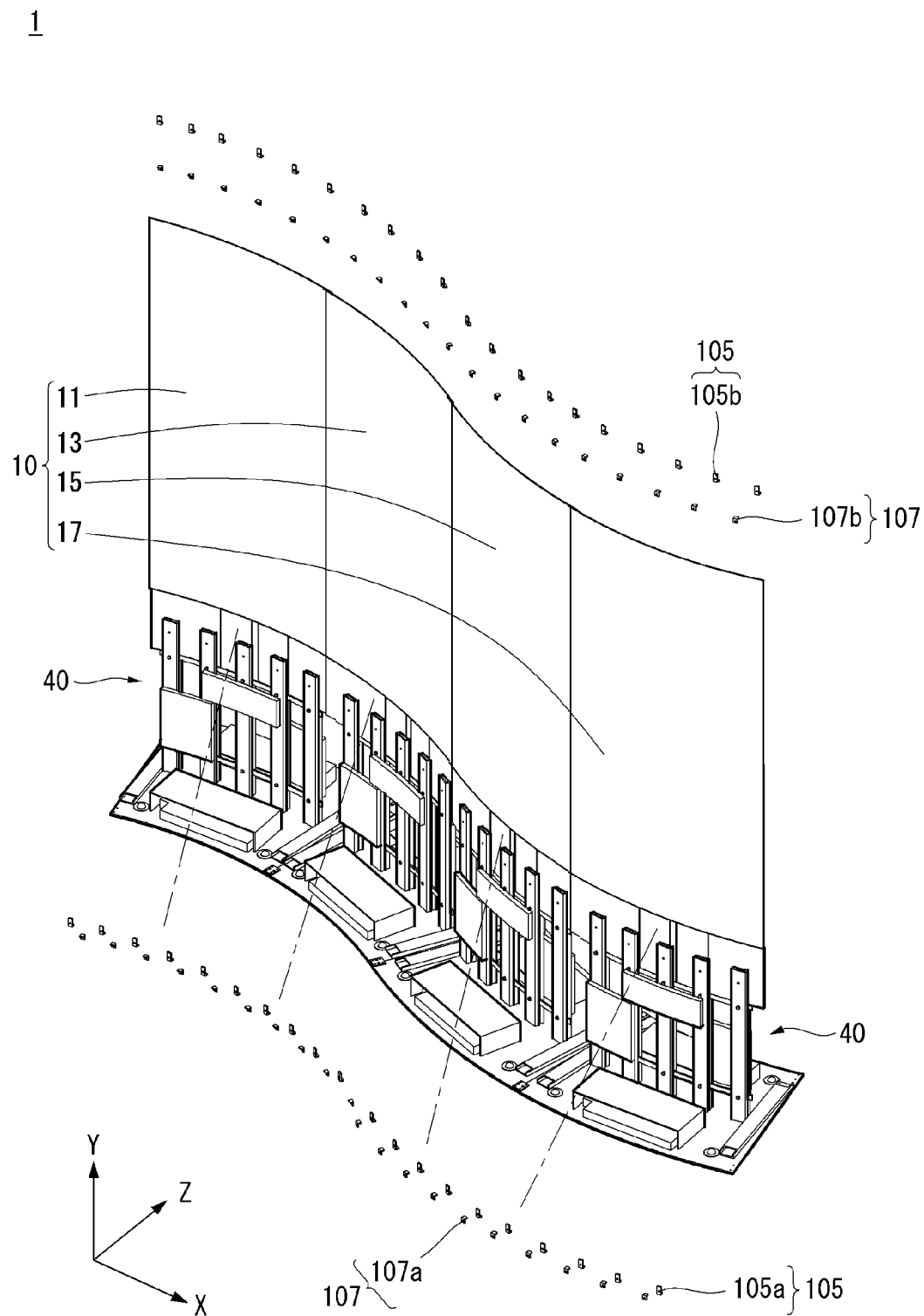
FIGS. 43, 44, 45, 46, 47 and 48 illustrate configuration of a cover assembly according to an embodiment of the invention.
Figure 44:
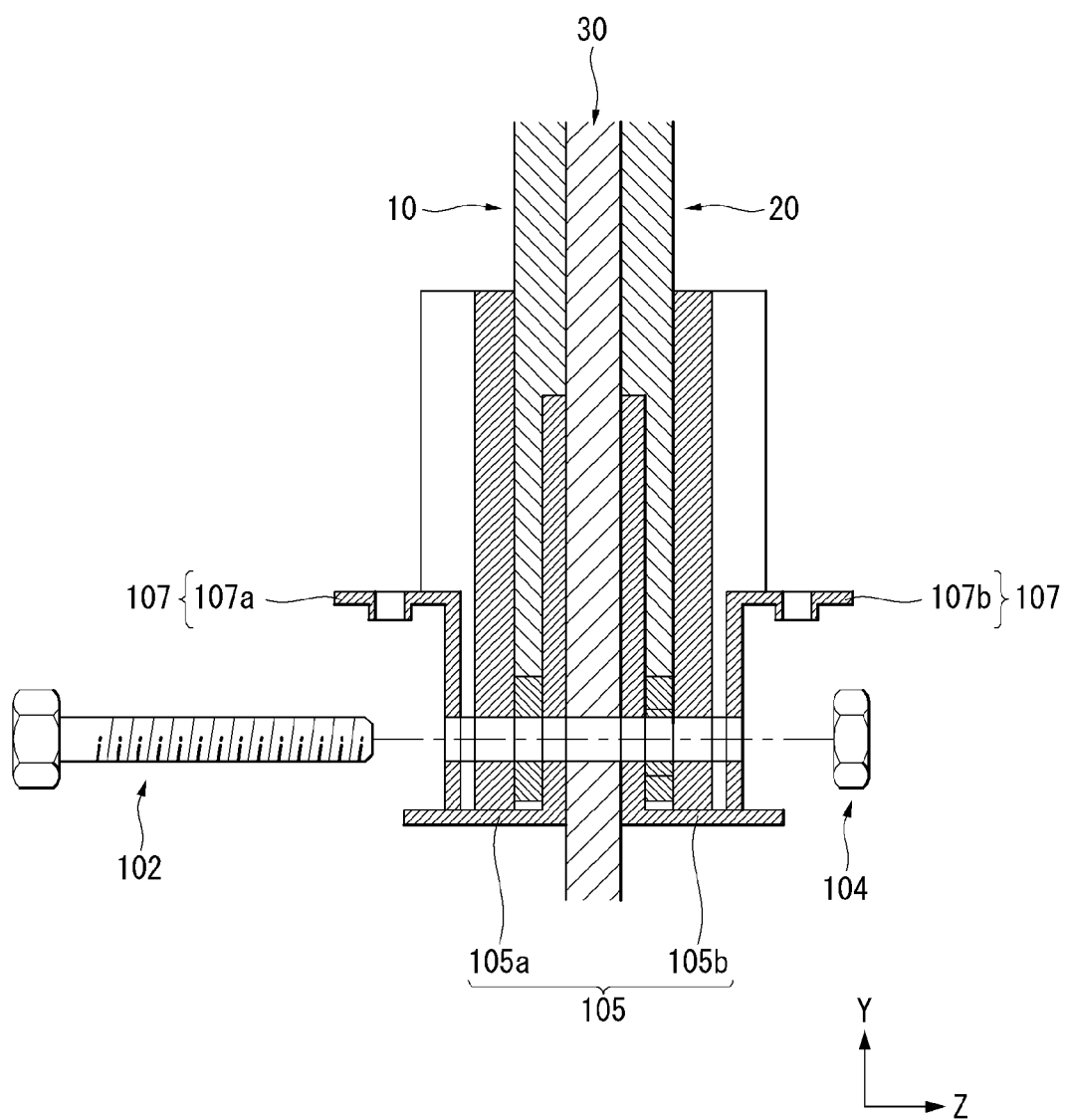

As shown in FIGS. 43 and 44, a stand supporter 107 may be coupled.

Bottom fixers 105 may be positioned at locations corresponding to each other on both side surfaces of the frame 30. For example, a first bottom fixer 105a may be positioned on one side surface of the frame 30 corresponding to the front panel 10, and a second bottom fixer 105b may be coupled to the other side surface of the frame 30 corresponding to the rear panel 20.

Figure 45:
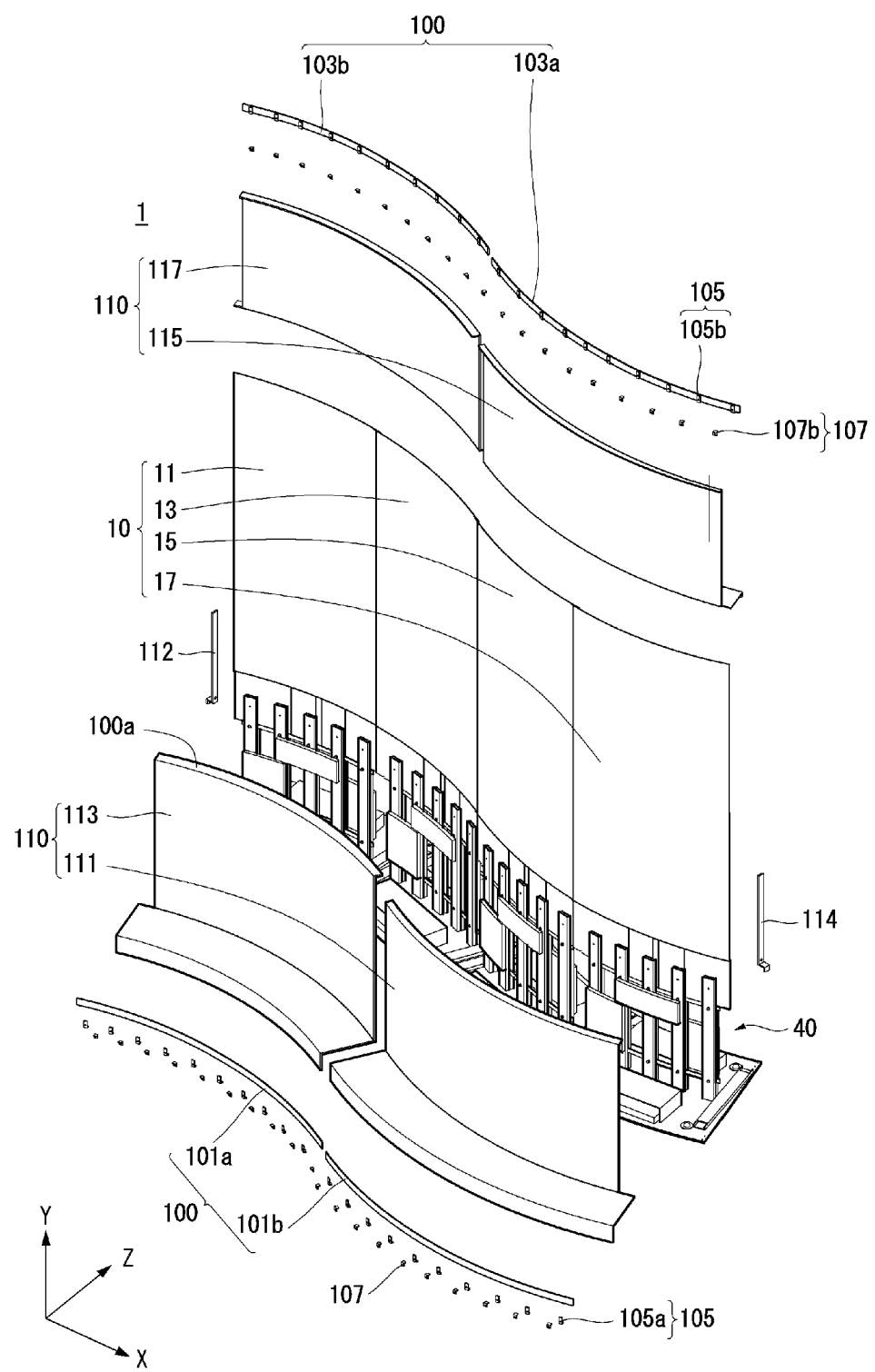

The stand supporter 107 may support a stand cover 110 (see FIG. 45). Namely, the stand supporter 107 may be a component to be coupled to an upper side of the stand cover 110.

The stand supporter 107 and the bottom fixer 105 may be coupled to the frame 30 by fastening means 102 and 104. The fastening means 102 and 104 may include a bolt 102 and a nut 104.

As shown in FIGS. 45 to 48, the display device 1 according to the embodiment of the invention may include the stand cover 110, stand side covers 112 and 114, and a bottom deco 100.

As shown in FIG. 45, the stand cover 110 may have a structure for shielding the stand assembly 40. Namely, the stand cover 110 may have a structure for forming an appearance of the stand assembly 40 in which various components are installed.

The bottom deco 100 may be positioned under the panel assemblies 10 and 20. For example, 1a and 1b bottom decos 101a and 101b may be coupled to one side of the panel assemblies 10 and 20, and 2a and 2b bottom decos 103a and 103b may be coupled to the other side of the panel assemblies 10 and 20.

The stand cover 110 may include first and second stand covers 111 and 113 corresponding to one side surface of the panel assemblies 10 and 20 and third and fourth stand covers 115 and 117 corresponding to the other side surface. Each stand cover 110 may correspond to the plurality of panel assemblies 10 and 20. For example, the first stand cover 111 may have a shape corresponding to the first and second panels 11 and 13.

The first stand cover 111 and the third stand cover 115 may have the same shape, and the second stand cover 113 and the fourth stand cover 117 may have the same shape. Therefore, the first and third stand covers 111 and 115 and the second and fourth stand covers 113 and 117 may be shared, thereby reducing the production and assembly cost.

The stand side covers 112 and 114 may be coupled to both sides of the stand assembly 40. The stand side covers 112 and 114 may form an appearance of the stand assembly 40 together with the stand cover 110.

The bottom deco 100 may be coupled to correspond to a top surface 100a of the stand cover 110. The structure related to the coupling of the bottom deco 100 is as described above.

The bottom deco 100 may achieve the beautiful appearance of the display device 1 in spite of an overlap structure of the panel assemblies 10 and 20. For example, the long sides of the first to fourth panels 11, 13, 15 and 17 may partially overlap one another as described above. The bottom deco 100 can prevent a stepped portion resulting from an overlap structure of the first to fourth panels 11, 13, 15 and 17 from appearing in the display device 1 through a stepped structure of the bottom deco 100.

Figure 46:
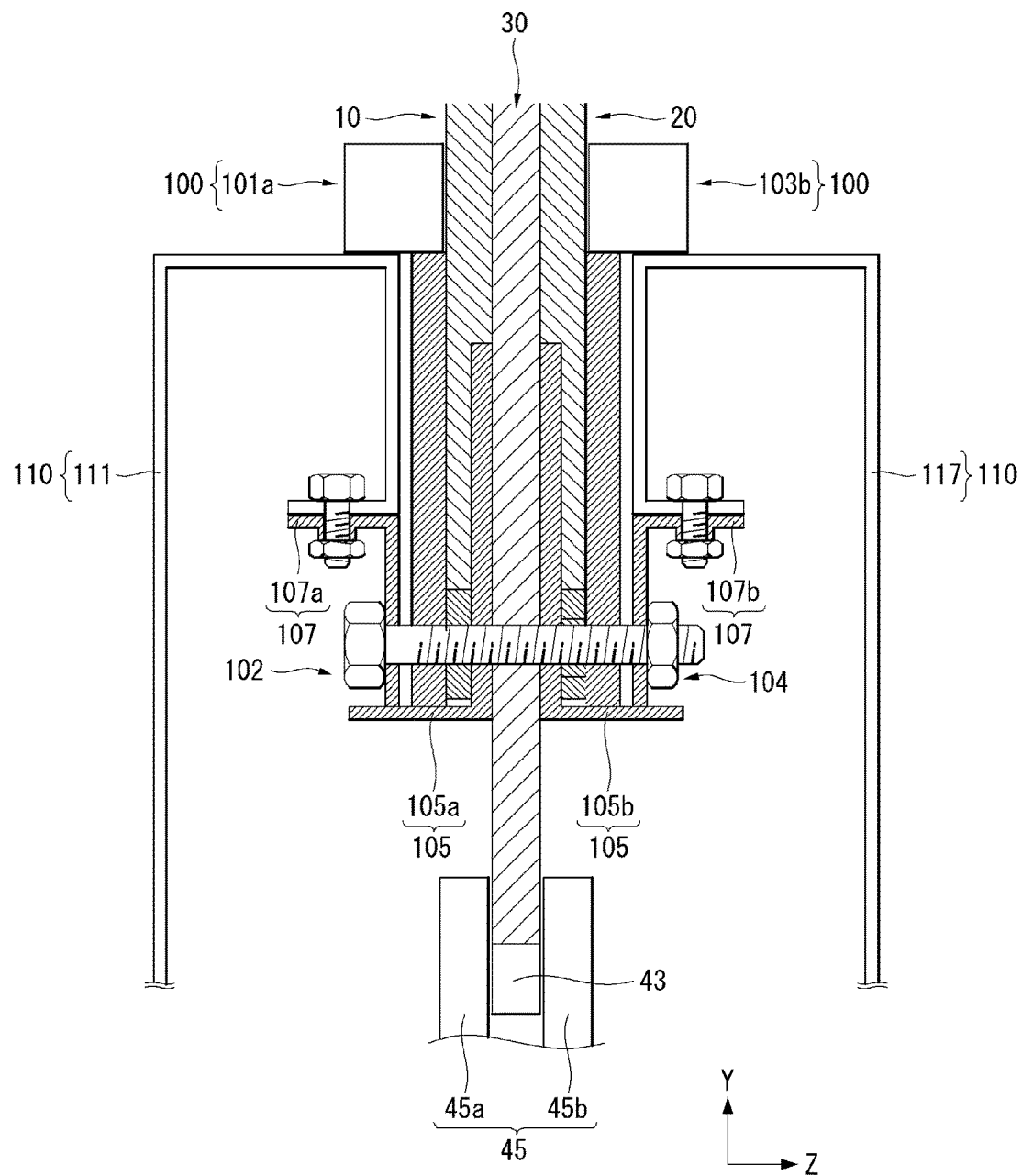

As shown in FIG. 46, a lower end part of the frame 30 may be positioned adjacent to the stand frame 45. For example, the first and second stand frames 45a and 45b may be positioned on both sides of the frame 30. A lower part of the frame 30 may be supported by the frame bar 43. Because the lower part of the frame 30 is extended downwardly, the frame 30 may be longer than the display panels 10 and 20.

The first and fourth stand covers 111 and 117 may be positioned on both sides of the frame 30. The first and fourth stand covers 111 and 117 may be coupled to first and second stand supporters 107a and 107b.

The 1a and 2b bottom decos 101a and 103b may be positioned on the first and fourth stand covers 111 and 117. The 1a and 2b bottom decos 101a and 103b may be positioned at boundaries between the first and fourth stand covers 111 and 117 and the panel assemblies 10 and 20, thereby achieving the beautiful appearance of the display device 1.

Figure 47:
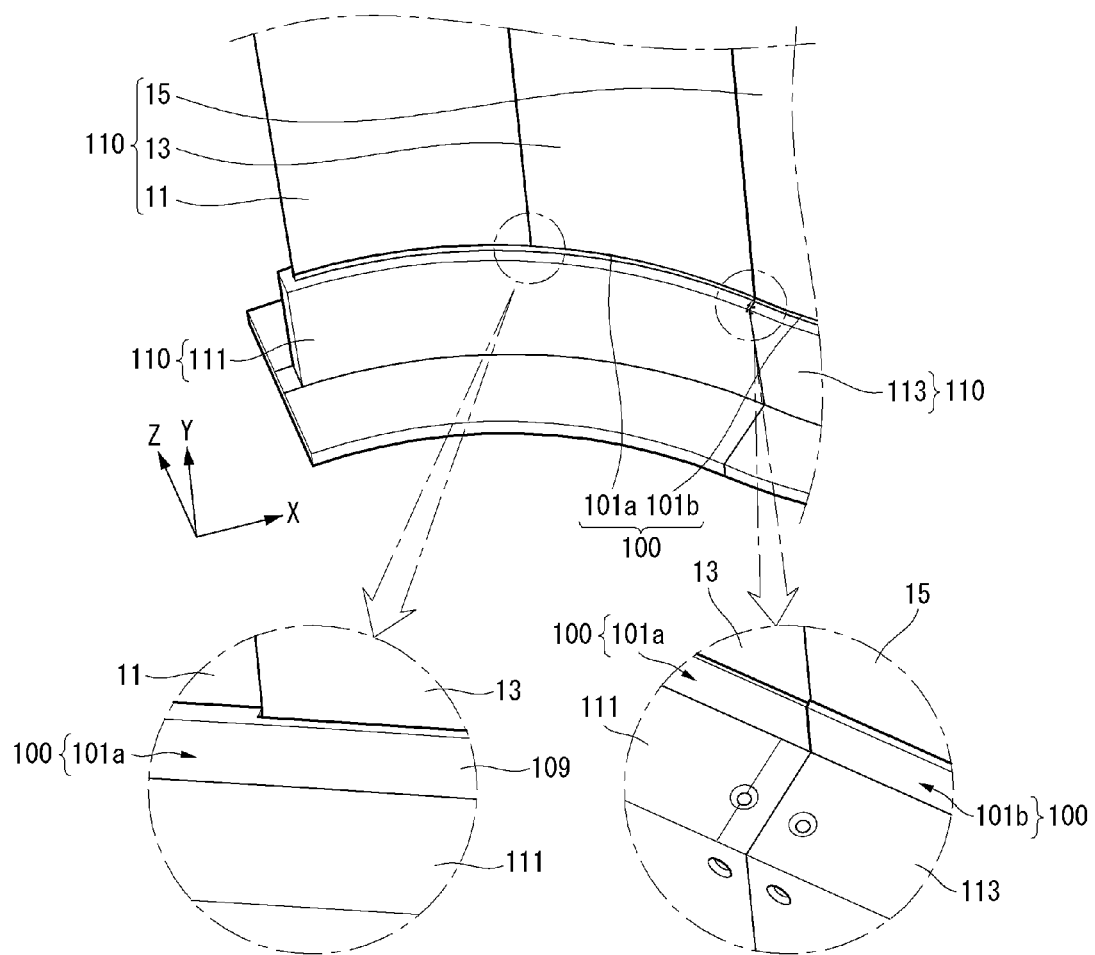

As shown in FIG. 47, the long side of the second front panel 13 may overlap the long side of the first front panel 11. Namely, the second front panel 13 may more protrude to the front than the first front panel 11 by a first distance HD1 (see FIG. 48) corresponding to a thickness of the second front panel 13. In the same manner as this, the long side of the third front panel 15 may more protrude to the front than the second front panel 13 by a distance corresponding to a thickness of the third front panel 15.

A front surface 109 of the bottom deco 100 may be flat regardless of a step structure of the panel assemblies 10 and 20. Namely, a distance protruded by the overlap of the panel assemblies 10 and 20 may be offset by the bottom deco 100.

The stand cover 110 may be flat regardless of the overlap of the panel assemblies 10 and 20. For example, the first stand cover 111 and the second stand cover 113 may be flat connected to each other regardless of a height difference resulting from the overlap of the second and third front panels 13 and 15. The flat surface of the stand cover 110 may be obtained by offsetting the height difference of the panel assemblies 10 and 20 by the bottom deco 100.

Figure 48:
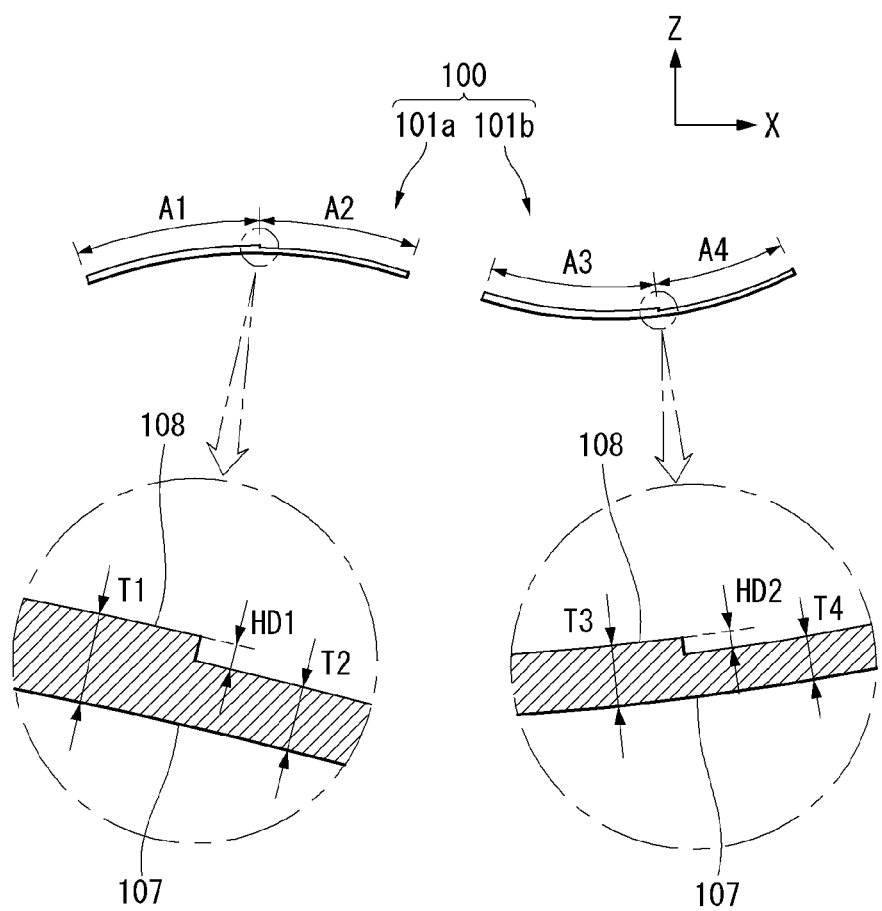

As shown in FIG. 48, the 1a bottom deco 101a may include a first area A1 and a second area A2. The first area A1 may correspond to the first front panel 11, and the second area A2 may correspond to the second front panel 13.

A boundary between the first and second areas A1 and A2 may have a height difference of the first distance HD1. Namely, a back surface 108 of the 1a bottom deco 101a may include a stepped portion having the height difference of the first distance HD1. A thickness of the 1a bottom deco 101a in the first area A1 may be expressed as T1, and a thickness of the 1a bottom deco 101a in the second area A2 may be expressed as T2. The first distance HD1 may be formed corresponding to a thickness of the second front panel 13.

A boundary between third and fourth areas A3 and A4 of the 1b bottom deco 101b may have a height difference of a second distance HD2. The second distance HD2 may correspond to a thickness of the fourth panel 17.

The thickness of the bottom deco 100 may vary from the first thickness T1 to a fourth thickness T4. Namely, the thickness of the bottom deco 100 may decrease in order to offset the thicknesses of the panels positioned on the back surface 108. The 2a and 2b bottom decos 103a and 103b may be in a shape symmetrical to the 1a and 1b bottom decos 101a and 101b.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device comprising: a stand assembly; a center frame correspondingly coupled to an upper portion of the stand assembly, the center frame having a curved surface comprising a concave surface and a convex surface; a first display panel curved along the curved surface coupled to the concave surface, and including a first edge, a first displaying area which an image is displayed, and a first non-displaying area which an image is not displayed and positioned between the first edge and the first displaying area; and a second display panel curved along the curved surface, coupled to the convex surface, and including a second edge, a second displaying area which an image is displayed, and a second-non displaying area which an image is not displayed and positioned between the second edge and the second displaying area, wherein the second non-displaying area and at least a portion of the second displaying area covers the first non-displaying area without covering the first displaying area.

2. The display device of claim 1, wherein:
the first non-displaying area is larger than the second non-displaying area.

3. The display device of claim 1, wherein a distance between the first edge and the first displaying area is greater than a distance between the second edge and the second displaying area.

4. The display device of claim 1, wherein the first display panel or the second display panel comprises at least one concave region and at least one convex region.

5. The display device of claim 1, wherein the first display panel has a concave display surface; and
the second display panel has a convex display surface.

6. The display device of claim 1, further comprising a stand cover coupled to the stand assembly, wherein:
the center frame comprises:
a first center frame coupled to the first display panel; and
a second center frame coupled to the second display panel,
wherein the stand assembly comprises:
a first stand assembly supporting the first center frame; and
a second stand assembly supporting the second center frame,
wherein the stand cover comprises:
a first stand cover covering the first stand assembly; and
a second stand cover covering the second stand assembly.

7. The display device of claim 1, wherein the second non-displaying area is configured to shield incoming light.

8. The display device of claim 1, wherein the second non-displaying area and the at least a portion of the second displaying area contact the first non-displaying area, and
wherein the second edge is positioned between the first displaying area and the first edge.

9. The display device of claim 1, wherein the second non-displaying area covers only the first non-displaying area.

* * * * *